United States Patent
Hammig et al.

(10) Patent No.: US 12,527,147 B2
(45) Date of Patent: Jan. 13, 2026

(54) SEMICONDUCTOR NANOPARTICLE-BASED DETECTION

(71) Applicant: The Regents of the University of Michigan, Ann Arbor, MI (US)

(72) Inventors: Mark Hammig, Dexter, MI (US); Nicholas Kotov, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 569 days.

(21) Appl. No.: 17/912,834

(22) PCT Filed: Mar. 19, 2021

(86) PCT No.: PCT/US2021/023098
§ 371 (c)(1),
(2) Date: Sep. 19, 2022

(87) PCT Pub. No.: WO2021/188868
PCT Pub. Date: Sep. 23, 2021

(65) Prior Publication Data
US 2023/0145015 A1    May 11, 2023

Related U.S. Application Data

(60) Provisional application No. 62/992,214, filed on Mar. 20, 2020.

(51) Int. Cl.
*H10K 30/35*    (2023.01)

(52) U.S. Cl.
CPC .................. *H10K 30/35* (2023.02)

(58) Field of Classification Search
CPC ........ H10K 30/35; H10K 30/50; G01T 1/366; H10F 30/301; H10F 71/00; H10F 77/162;
(Continued)

(56) References Cited

U.S. PATENT DOCUMENTS 6,846,638 B2    1/2005  Shipwash
7,480,433 B2 *  1/2009  Walt ............... A61N 5/0622
                                                         385/115
(Continued)

FOREIGN PATENT DOCUMENTS

WO    2010054831 A2    5/2010
WO    2010130847 A1   11/2010
WO    2021105162 A2    6/2021

OTHER PUBLICATIONS

OSTI.GOV record of the Thomas et al., NPL reference "Manufacturing of low-background coper electrical components for rare-event detection.", 2 pages, accessed online Jun. 9, 2025 (Year: 2025).*

(Continued)

*Primary Examiner* — Earl N Taylor
(74) *Attorney, Agent, or Firm* — Lempia Summerfield Katz LLC

(57) ABSTRACT

A detector includes a substrate including a matrix of aramid nanofibers, a distribution of nanoparticles across the matrix of aramid nanofibers, and a plurality of organic capping ligands. Each organic capping ligand of the plurality of organic capping ligands bonds a respective nanoparticle of the plurality of nanoparticles to a respective aramid nanofiber of the matrix of aramid nanofibers. The detector further includes first and second electrodes disposed along opposite sides of the substrate to capture charges generated by photons or particles incident upon the detector. Each nanoparticle of the plurality of nanoparticles has a semiconductor composition.

20 Claims, 15 Drawing Sheets

(58) Field of Classification Search
CPC ....... H10F 77/20; Y02E 10/549; H01L 31/18; H01L 31/085; H01L 31/0224; H01L 31/0384; H01L 51/42; H01L 51/426

See application file for complete search history.

(56) References Cited

U.S. PATENT DOCUMENTS

| | | | |
|---|---|---|---|
| 8,565,860 | B2 | 10/2013 | Kimchy et al. |
| 9,625,341 | B2 | 4/2017 | Haick et al. |
| 2008/0128021 | A1* | 6/2008 | Choudhury ............ B82Y 30/00 136/256 |
| 2009/0090413 | A1 | 4/2009 | Katsoulis et al. |
| 2012/0073565 | A1 | 3/2012 | Grant |
| 2013/0288050 | A1* | 10/2013 | Arruda ...................... B32B 5/22 428/401 |
| 2019/0085139 | A1* | 3/2019 | Kotov ..................... B29B 13/06 |
| 2023/0130304 | A1* | 4/2023 | Tsotsis .............. C04B 35/62222 264/603 |
| 2023/0260680 | A1* | 8/2023 | Hammig ................ H01B 1/026 252/512 |

OTHER PUBLICATIONS

OSTI.GOV search results of the Thomas et al., NPL reference "Manufacturing of low-background coper electrical components for rare-event detection.", 3 pages, accessed online Jun. 9, 2025 (Year: 2025).*

OSTI.GOV Publications Public Access Guidance information, 3 pages, accessed online Jun. 9, 2025 (Year: 2025).*

Abhinav Anand et al.; Optical and Scintillation Properties of Record-Efficiency CdTe Nanoplatelets toward Radiation Detection Applications; Nano Letters 2022, vol. 22, pp. 8900-8907.

Bastus NG et al; Synthesis of Highly Monodisperse Citrate-Stabilized Silver Nanoparticles of up to 200 nm: Kinetic Control and Catalytic Properties; Chemistry of Materials 2014; vol. 26; pp. 2836-2846.

Beard MC et al.; Comparing multiple exciton generation in quantum dots to impact ionization in bulk semiconductors: implications for enhancement of solar energy conversion; Nano letters 2010; vol. 10; pp. 3019-3027.

Dujardin C et al.; Luminescence and scintillation properties at the nanoscale; IEEE Transactions on Nuclear Science 2010; vol. 57; pp. 1348-1354.

Dujardin C et al.; Needs, trends, and advances in inorganic scintillators; IEEE Transactions on Nuclear Science 2018; vol. 65; pp. 1977-1997.

European Search Report of the European Patent Office cited in corresponding patent application No. 21772373.3; Apr. 2, 2024; 12 pp.

Gao Z et al.; Self-powered flexible and transparent photovoltaic detectors based on CdSe nanobelt/graphene Schottky junctions; Nanoscale 2013; vol. 5; pp. 5576-5581.

Gaponik N et al.; Thiol-capping of CdTe nanocrystals: an alternative to organometallic synthetic routes; The Journal of Physical Chemistry B. 2002; vol. 106; pp. 7177-7185.

Gong Y et al.; Incorporating fluorescent CdTe nanocrystals into a hydrogel via hydrogen bonding: toward fluorescent microspheres with temperature-responsive properties; Chemistry of materials 2005; vol. 17; pp. 2648-2653.

Guss P et al.; Lanthanum halide nanoparticle scintillators for nuclear radiation detection; Journal of Applied Physics 2013; vol. 113; pp. 064303.

Hmar J et al.; Flexible, transparent, high dielectric and photoconductive thin films using ZnO nanosheets-multi-walled carbon nanotube-polymer nanocomposites; Journal of Alloys and Compounds 2015; vol. 651; pp. 82-90.

Hovington, P. et al.; "Casino: A new Monte Carlo code in C language for electron beam interaction, part I: Description of the program", Scanning 1997; vol. 19; pp. 1-14.

International Preliminary Report on Patentablility of the International Bureau of WIPO cited in corresponding international patent application No. PCT/US2021/023098; Sep. 20, 2022; 8 pp.

J. Lyu et al.; High Strength Conductive Composites with Plasmonic Nanoparticles Aligned on Aramid Nanofibers; Adv. Funct. Mater. vol 26, 2016, pp. 8435-8445.

Jing Lyu et al.; Stretchable conductors by kirigami patterning of aramid-silver nanocomposites with zero conductance gradient, Appl. Phys. Lett 2017, vol. 111; pp. 161901.

Jung YJ et al.; Aligned carbon nanotube—polymer hybrid architectures for diverse flexible electronic applications; Nano letters 2006; vol. 6; pp. 413-418.

Los Alamos National Laboratory, MCNP Users Manual—Code Version 6.2, report LA-UR-17-29981; 2017; pp. 746.

M. Yang et al., Dispersions of Aramid Nanofibers: A New Nanoscale Building Block; ACS Nano 2011, vol. 5, pp. 6945-6954.

Mark D. Hammig; Nanoscale Methods to Enhance the Detection of Ionizing Radiation, Current Topics in Ionizing Radiation Research, InTech, 2012, 24 pp.

McGuire JA et al.; Apparent versus true carrier multiplication yields in semiconductor nanocrystals. Nano letters 2010; vol. 10; pp. 2049-2057.

McKigney EA et al.; Nanocomposite scintillators for radiation detection and nuclear spectroscopy; Nuclear Instruments and Methods in Physics Research Section A: Accelerators, Spectrometers, Detectors and Associated Equipment 2007; vol. 579; pp. 15-18.

Oliveira J et al.; Stretchable scintillator composites for indirect X-ray detectors; Composites Part B: Engineering 2018; vol. 133; pp. 226-231.

Park J et al.; Material approaches to stretchable strain sensors; ChemPhysChem. 2015; vol. 16; pp. 1155-1163.

Pushparaj VL et al.; Flexible energy storage devices based on nanocomposite paper; Proceedings of the National Academy of Sciences 2007; vol. 104; pp. 13574-13577.

Segev-Bar M et al.; Flexible sensors based on nanoparticles; ACS Nano 2013; vol. 7; pp. 8366-8378.

Semonin OE et al.; Peak external photocurrent quantum efficiency exceeding 100% via MEG in a quantum dot solar cell; Science 2011; vol. 334; pp. 1530-1533.

Shokr F.; Evaluation of the optical properties of photoconductive Eosin/PMMA nanocomposite film for flexible optoelectronic applications; Optik 2017; vol. 149; pp. 270-276.

Son DI et al.; Transparent and flexible ultraviolet photodetectors based on colloidal ZnO quantum dot/graphene nanocomposites formed on poly (ethylene terephthalate) substrates; Composites Part B: Engineering. 2015; vol. 69; pp. 154-158.

Thomas Christopher et al., Manufacturing of Low-Background Copper Electrical Components for Rare-Event Detection, Galt LLC Final Technical Report, Jan. 2019, 74 pp.

Trung TQ et al.; Infrared detection using transparent and flexible field-effect transistor array with solution processable nanocomposite channel of reduced graphene oxide and P(VDF-TrFE); Advanced Functional Materials 2015; vol. 25, pp. 1745-1754.

Turtos RM et al.; On the use of CdSe scintillating nanoplatelets as time taggers for high-energy gamma detection; npj 2D Materials and Applications 2019; vol. 9; pp. 1-10.

Ummartyotin S et al.; A comprehensive review on ZnS: From synthesis to an approach on solar cell; Renewable and Sustainable Energy Reviews 2016; vol. 55; pp. 17-24.

Volodymyr Dzhagan et al.; Phonon Raman spectra of colloidal CdTe nanocrystals: effect of size, non-stoichiometry and ligand exchange; Nanoscale Research Letters 2011; vol. 6, pp. 1-10.

Wang W et al.; Transparent ultrathin oxygen-doped silver electrodes for flexible organic solar cells; Advanced Functional Materials 2014; vol. 24; pp. 1551-1561.

Xu H et al.; Flexible fiber-shaped supercapacitors based on hierarchically nanostructured composite electrodes; Nano Research 2015; vol. 8; pp. 1148-1158.

Xu S et al.; pH-sensitive photoluminescence for aqueous thiol-capped CdTe nanocrystals; Nanotechnology 2011; vol. 22; pp. 315703.

(56) References Cited

OTHER PUBLICATIONS

Christopher Thomas et al., "Manufacturing of Low-Background Copper Electrical Components of Rare-Event Detection", Jan. 2019, Galt LLC.

International Search Report and Written Opinion of the International Searching Authority from International Patent Application No. PCT/US2021/023098, dated Jul. 21, 2021, 11 pages.

* cited by examiner

SEMICONDUCTOR NANOPARTICLE-BASED DETECTION

CROSS-REFERENCE TO RELATED APPLICATION

This U.S. National Phase application is based on International Application No. PCT/US2021/023098, filed Mar. 19, 2021, which claims the benefit of U.S. provisional application entitled "Semiconductor Nanoparticle-Based Detection," filed Mar. 20, 2020, and assigned Ser. No. 62/992,214, the entire disclosures of which are hereby expressly incorporated by reference. Priority benefit of these earlier filed applications is hereby claimed.

STATEMENT REGARDING FEDERALLY SPONSORED RESEARCH OR DEVELOPMENT

This invention was made with government support under Contract No. DHS-16-DNDO-077-NC001 awarded by the Department of Homeland Security, and under Contracts Nos. HDTRA-1-11-1-0050, HDTRA1-12-1-0038, and HDTRA1-13-C-0050 awarded by the Department of Defense. The government has certain rights in the invention.

BACKGROUND OF THE DISCLOSURE

Field of the Disclosure

The disclosure relates generally to particle and/or photon detection.

Brief Description of Related Technology

Optoelectronic devices that are flexible, stretchable, or moldable are useful in applications that involve installation on complex or other surfaces, such as those that involve curved interfaces and variable stresses. For instance, devices that are portable, wearable, and low-cost have been of interest for sensor applications, displays, energy storage, and solar cells. These devices have been formed through the incorporation of functionalized nanomaterials in a mechanically strong and flexible polymer matrix.

Ionizing particle and/or photon detection has many applications that would benefit from a detection material that is wearable, portable, or moldable into complex geometries. For instance, various monitoring and security applications would benefit from a patch or badge-like device that could passively detect and identify a gamma ray source. The problem is that existing materials for detecting ionizing radiation are primarily high purity single-crystalline semiconductor or scintillating devices. While single-crystalline devices have markedly good electron and hole transport properties that have made them suitable for various spectroscopic detection applications, single-crystalline devices are inadequate for high-resolution portable applications. There is an intrinsic loss of performance when attempting to translate traditional materials to a flexible or portable detector, through reduced interaction cross-section and a greater number of barriers for charge transport, or the presence of logistical burdens that prevent practical portable use.

Nano-scale approaches have been attempted for spectroscopic gamma-ray detection. Previous nano-scale approaches have relied upon composite materials containing scintillating inorganic nanoparticles. Such nano-scintillator materials however do not solve the problem at hand, suffering from a low active volume fraction in the composite materials, as well as low energy resolution. The multiple energy-transfer processes involved in scintillation detection render the detectors less efficient than solid-state semiconductor detectors.

SUMMARY OF THE DISCLOSURE

In accordance with one aspect of the disclosure, a detector includes a substrate including a matrix of aramid nanofibers, a distribution of nanoparticles across the matrix of aramid nanofibers, a plurality of organic capping ligands, each organic capping ligand of the plurality of organic capping ligands bonding a respective nanoparticle of the distribution of nanoparticles to a respective aramid nanofiber of the matrix of aramid nanofibers, and first and second electrodes disposed along opposite sides of the substrate to capture charges generated by photons or particles incident upon the detector. Each nanoparticle of the distribution of nanoparticles has a semiconductor composition.

In accordance with another aspect of the disclosure, a method of fabricating a detector includes preparing a film including a matrix of aramid nanofibers, synthesizing, in a solution, a plurality of nanoparticles, each nanoparticle of the plurality of nanoparticles being synthesized such that an organic capping ligand is attached to the nanoparticle, and infiltrating the film with the plurality of nanoparticles such that each nanoparticle of the plurality of nanoparticles is bonded to a respective aramid nanofiber of the matrix of aramid nanofibers via the organic capping ligand. Each nanoparticle of the plurality of nanoparticles has a semiconductor composition.

In connection with any one of the aforementioned aspects, the detectors and/or methods described herein may alternatively or additionally include or involve any combination of one or more of the following aspects or features. Each aramid nanofiber of the matrix of aramid nanofibers includes a fiber backbone. The nanoparticles of the distribution of nanoparticles are aligned along the backbones of the matrix of aramid nanofibers. The plurality of organic capping ligands establish hydrogen bonds with the matrix of aramid nanofibers. Each organic capping ligand of the plurality of organic capping ligands includes 1-thioglycerol (TGOL). Each organic capping ligand of the plurality of organic capping ligands includes Thioglycolic acid (TGA). The semiconductor composition includes cadmium telluride. The cadmium telluride includes cadmium and tellurium in a two-to-one ratio, respectively. The semiconductor composition includes lead telluride. The detector further includes a plurality of metal nanoparticles distributed across the matrix of aramid nanofibers. Each metal nanoparticle of the plurality of metal nanoparticles includes silver. The first electrode includes a gold hole transport layer. The second electrode includes an indium electron transport layer. Each nanoparticle of the distribution of nanoparticles is sized to establish a bandgap for detection of ionizing radiation. At least some nanoparticles of the distribution of nanoparticles have a diameter less than about 10 nanometers. The substrate and the first and second electrodes are disposed in respective layers of a planar structure. The planar structure has a thickness falling in a range from about 30 micrometers to about 50 micrometers. Synthesizing the plurality of nanoparticles includes implementing a vacuum filtration procedure in which the film is disposed as a filtration membrane. The method further includes synthesizing, in a further solution, a plurality of metal nanoparticles, and infiltrating the film with the plurality of metal nanoparticles after infiltrating the film with the plurality of nanoparticles having the semiconductor composition. The method further includes depositing first and second electrodes along opposite sides of the film. Synthesizing the plurality of nanoparticles includes adding 1-thioglycerol (TGOL) to the solution to provide the organic capping ligand for each nanoparticle of the plurality of nanoparticles.

BRIEF DESCRIPTION OF THE DRAWING FIGURES

For a more complete understanding of the disclosure, reference should be made to the following detailed description and accompanying drawing figures, in which like reference numerals identify like elements in the figures.

Figure 7:
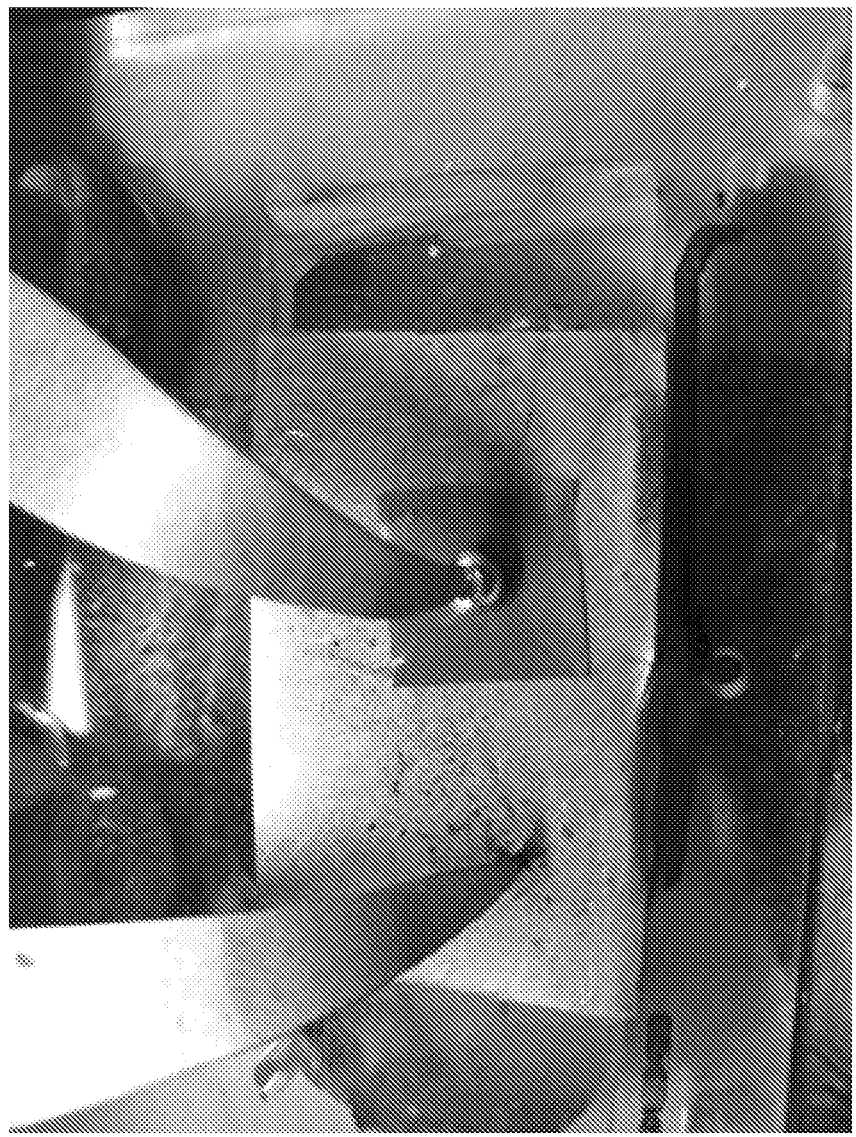

FIG. 7 a perspective view of a detector with a TGOL-CdTe composite structure in accordance with one example.

Figure 8:
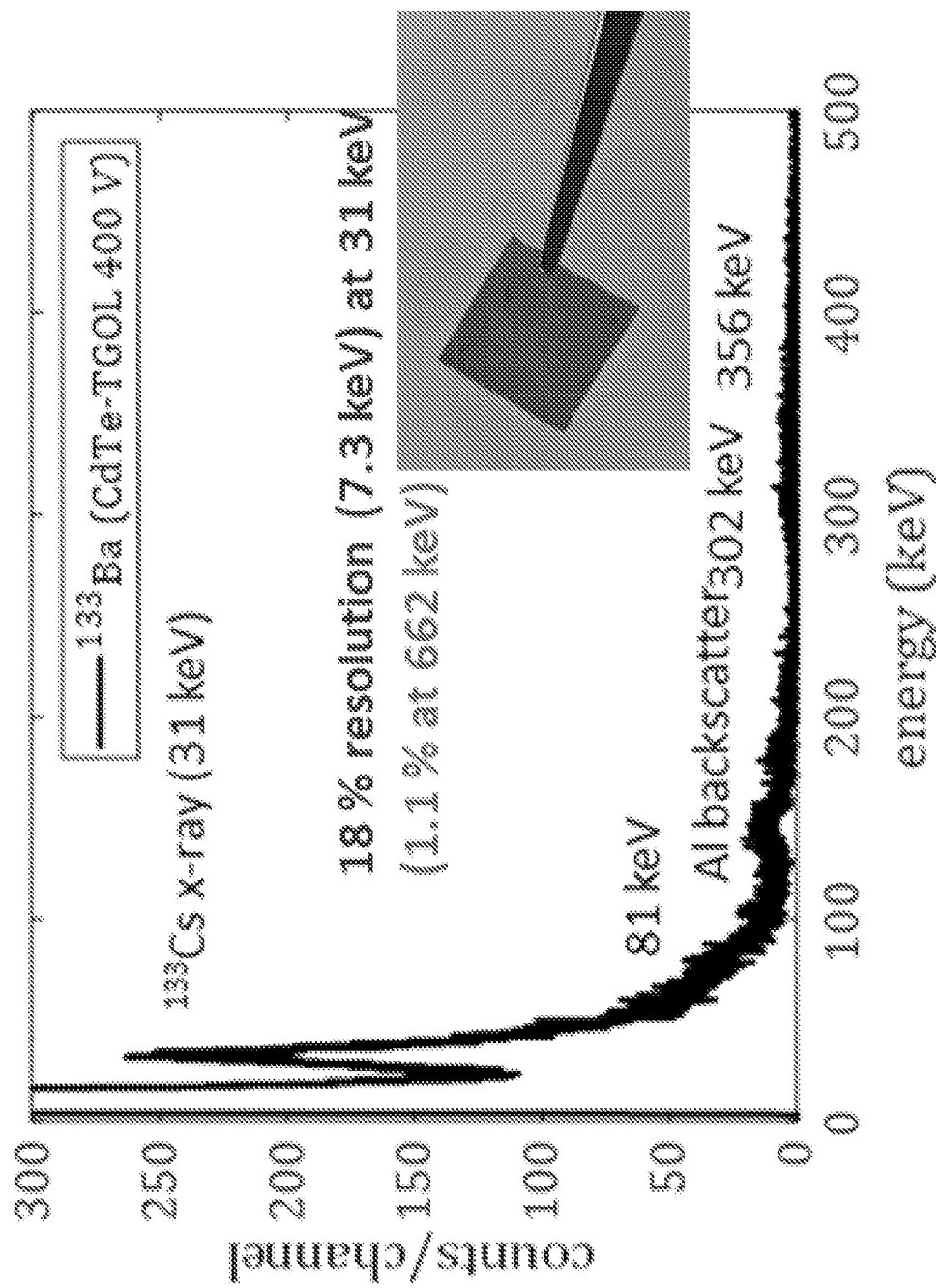

FIG. 8 depicts a graphical plot of the spectroscopic output of the detector of FIG. 7 for a Ba-133 gamma ray source.

Figure 9:
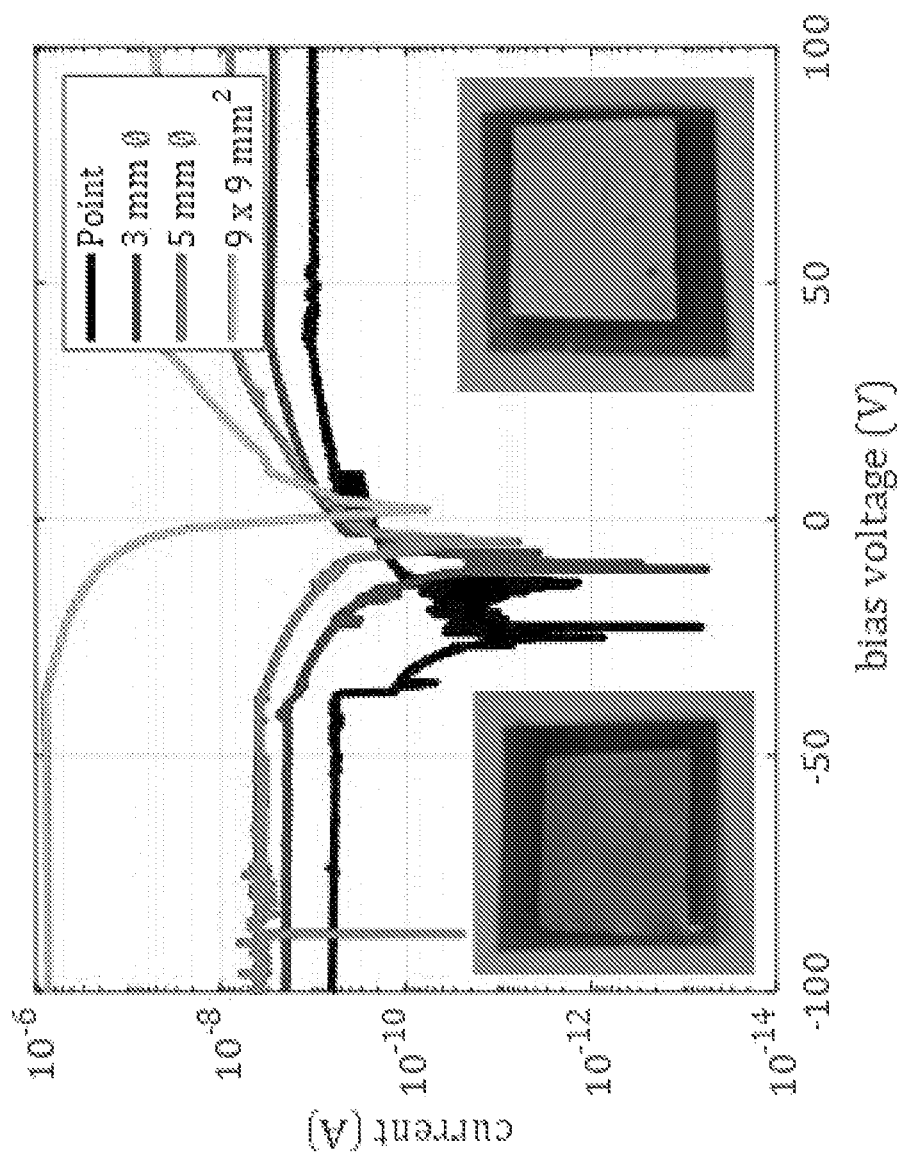

FIG. 9 depicts a detector with evaporated contacts in accordance with one example, along with a graphical plot of leakage current exhibited by the detector.

Figure 10:
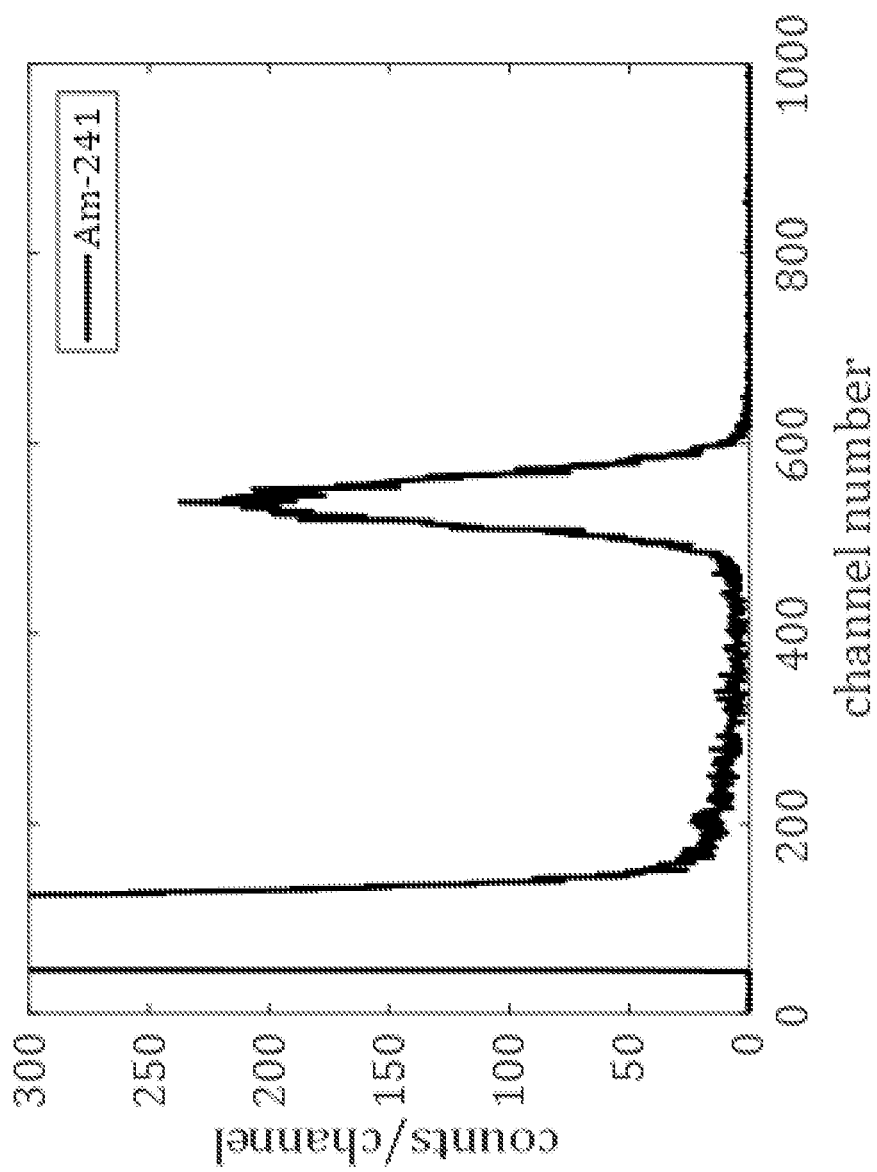

FIG. 10 depicts a graphical plot of an alpha particle spectra ($^{241}$Am) for the detector of FIG. 9, operated at a bias voltage of 44.7 Volts.

Figure 11:
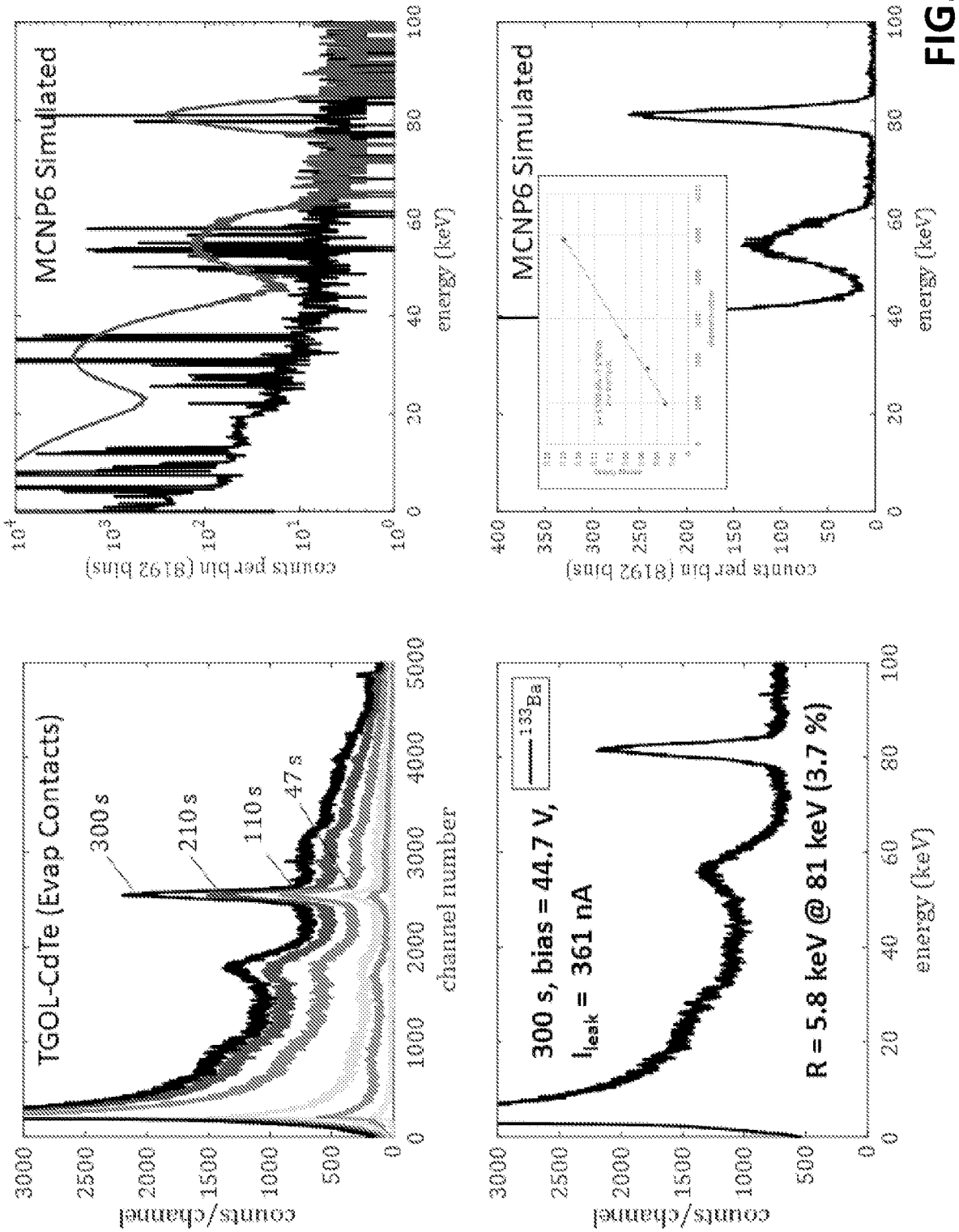

FIG. 11 depicts graphical plots of measured and simulated spectroscopic performance of detectors having a TGOL-CdTe-based composite structure in accordance with one example.

Figure 12:
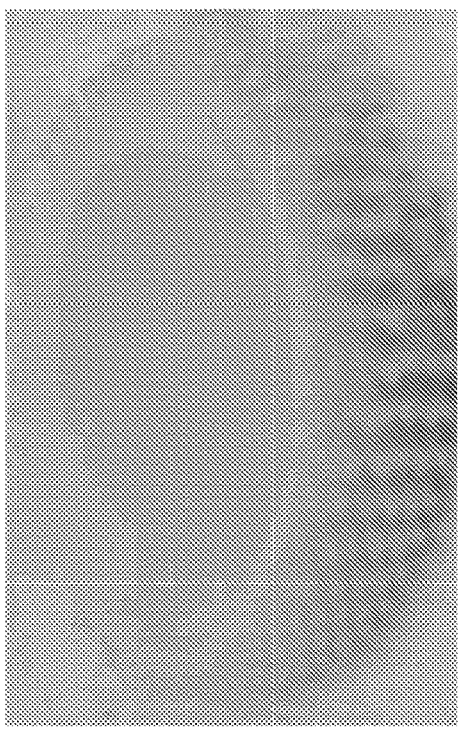
Figure 12:
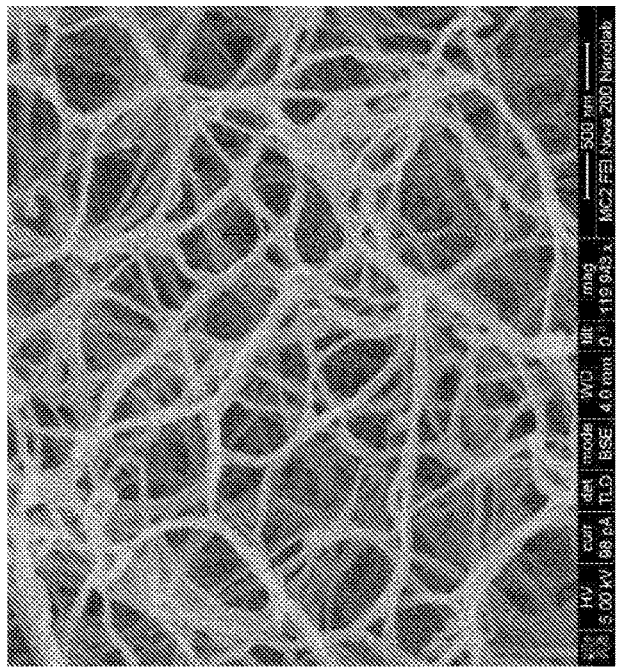
Figure 12:
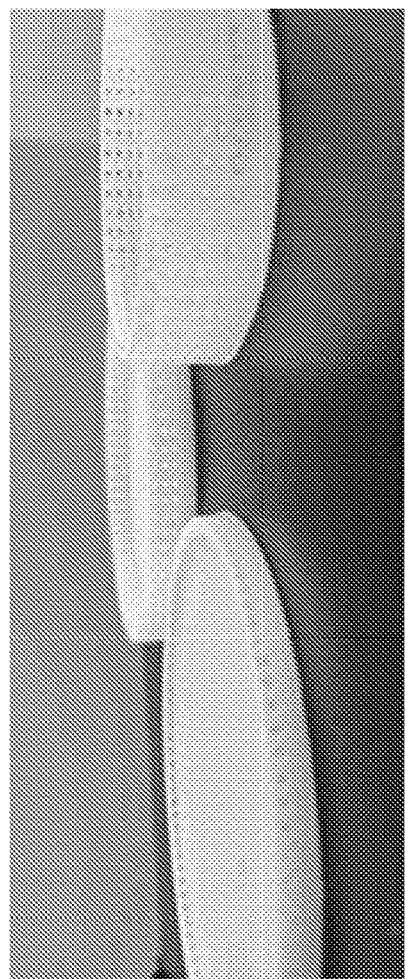
Figure 12:
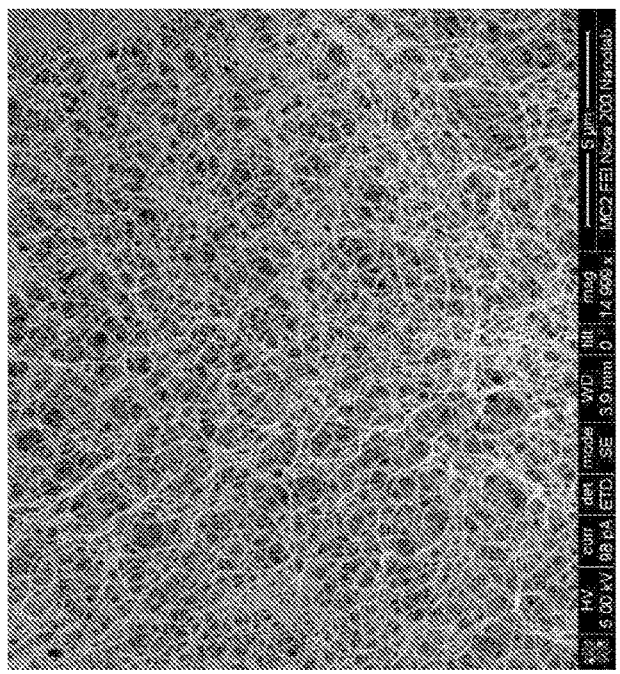

FIG. 12 depicts perspective views of three-dimensional molds into which ANF solutions are poured, and the resulting 1 cm hydrogel, as well as SEM micrographs of freeze-dried ANF derived from Kevlar in thread form at two different scales.

Figure 13:
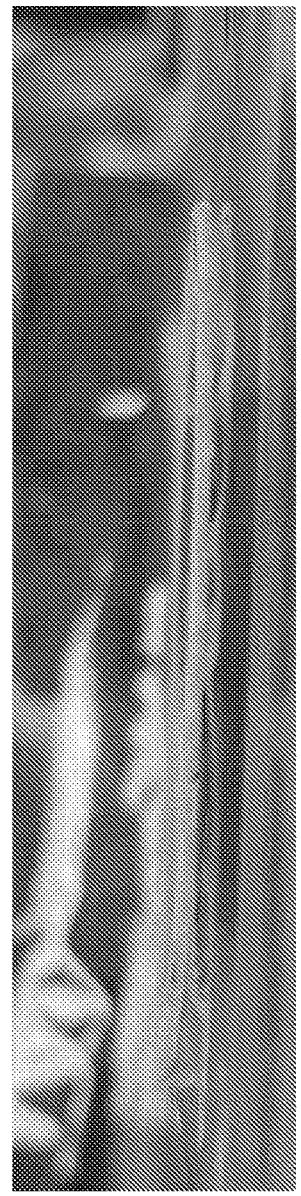
Figure 13:
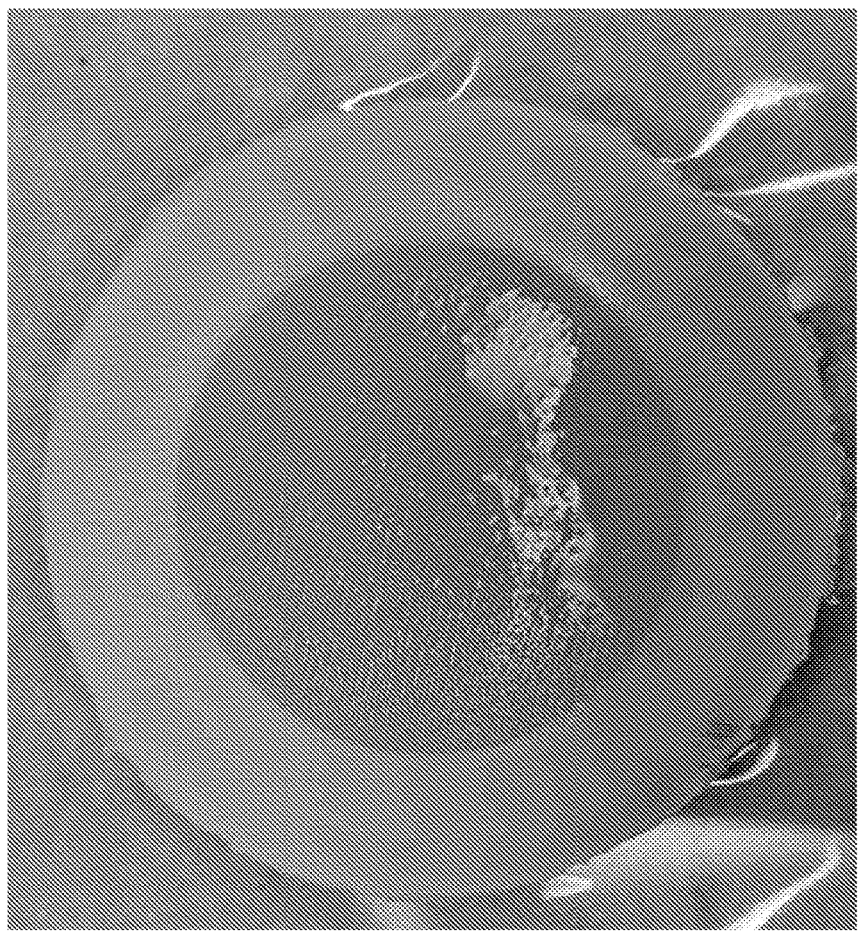

FIG. 13 depicts plan and side views of a composite structure fabricated using the molds of FIG. 12 to infiltrate the ANF with CdTe nanoparticles in accordance with one example.

Figure 14:
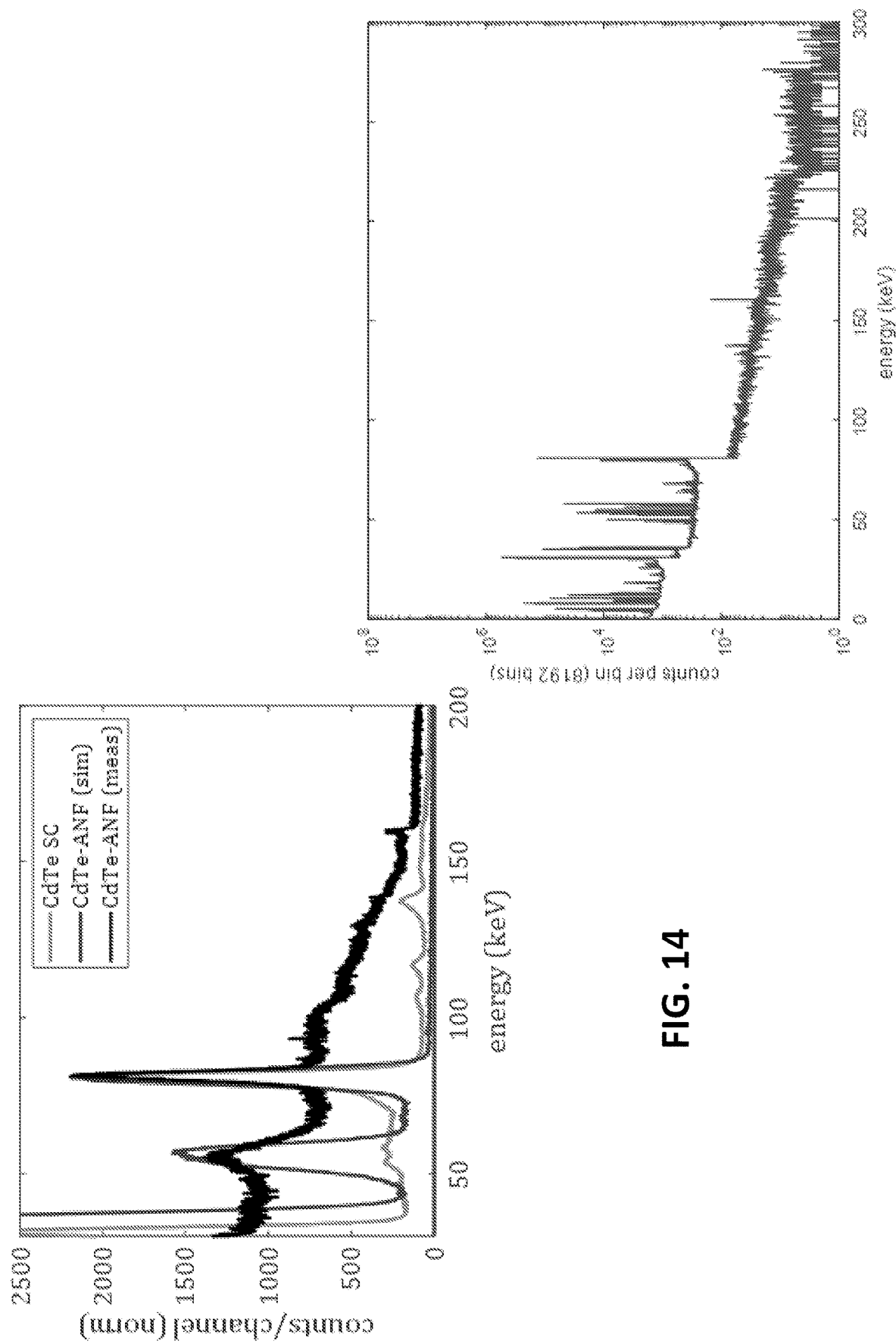

FIG. 14 depicts graphical plots of the measured and simulated spectroscopic performance of the composite structure of FIG. 13 in comparison with a commercial CdTe single crystalline detector.

Figure 15:
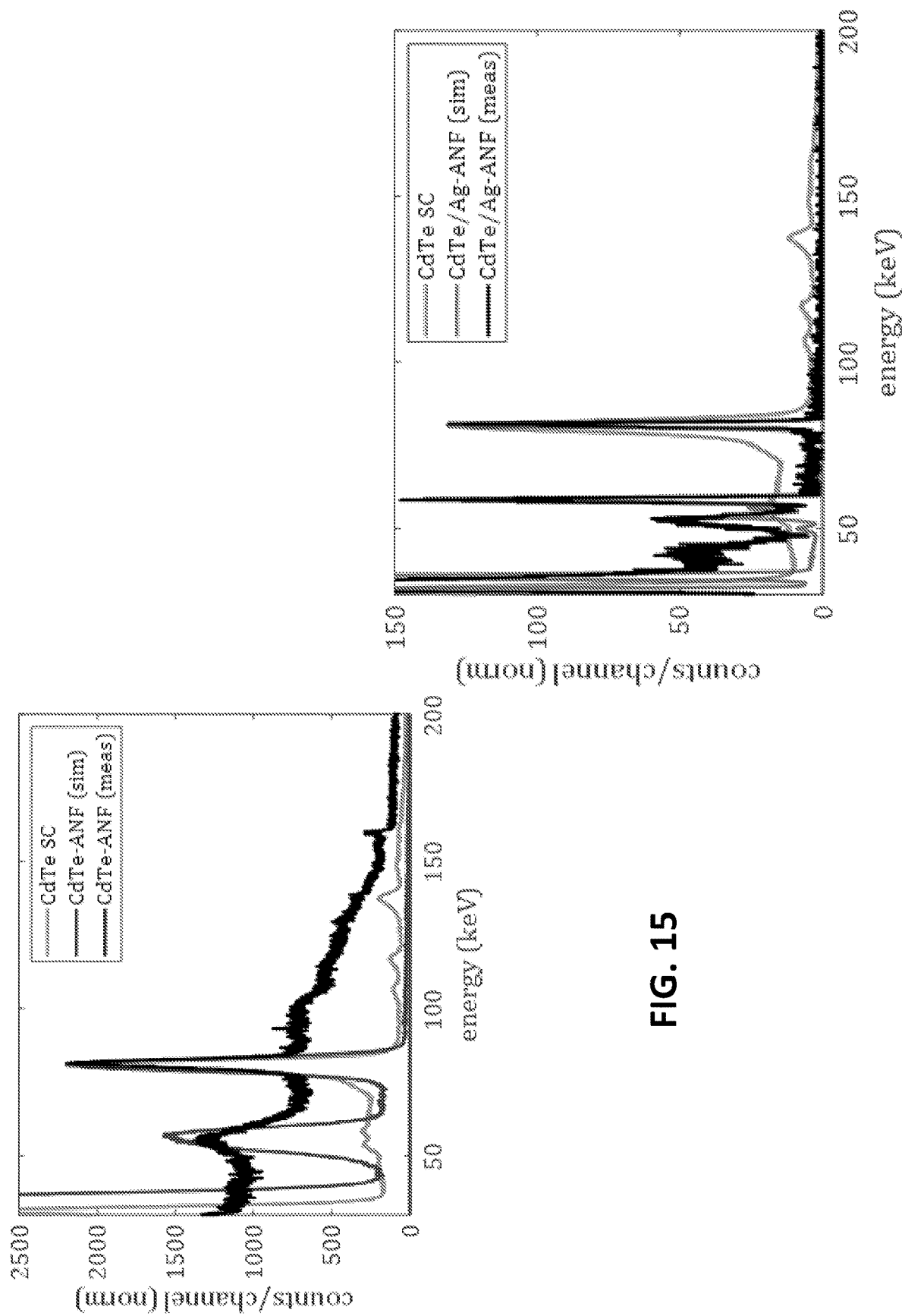

FIG. 15 depicts graphical plots of gamma ray spectra from $^{133}$Ba from detectors in accordance with examples having a CdTe-ANF composite structure and a CdTe/Ag-ANF composite structure.

The embodiments of the disclosed devices and methods may assume various forms. Specific embodiments are illustrated in the drawing and hereafter described with the understanding that the disclosure is intended to be illustrative. The disclosure is not intended to limit the invention to the specific embodiments described and illustrated herein.

DETAILED DESCRIPTION OF THE DISCLOSURE

The disclosed devices and methods are directed to nanoscale approaches to particle and/or photon detection. The disclosed devices include semiconducting nanoparticles or semiconducting nanocomposite structures. The disclosed devices and methods provide detector materials with nanoscale features configured to achieve spectroscopic detection with adequate resolution. For instance, the semiconducting nanocomposite structures of the disclosed devices may be useful in, for instance, spectroscopic gamma-ray detection. The detector materials may provide the spectroscopic detection in applications that require portability, flexibility, or passive detectors.

The disclosed devices and systems are based on detector films or other structures having a semiconducting nanocomposite structure in which semiconducting nanoparticles are aligned or otherwise disposed on aramid nanofibers. The use of aramid nanofibers allows flexible high-strength photon detector devices and systems to be realized. As described herein, such nano-scale features allow the disclosed devices and systems to achieve resolute solid-state detection in a lightweight, strong, and flexible composite thin-film structure. The structures are capable of measuring high energy x-rays and gamma-rays with good energy resolution.

The semiconducting nanocomposite structure of the disclosed detectors differ from other composite structures, such as composite structures composed of metallic gold (Au) or silver (Ag) nanoparticles contained in a matrix of aramid nanofibers (ANF). The ANF hydrogel films of the disclosed detectors are instead infiltrated with semiconducting (e.g., CdTe) nanoparticles to create a flexible composite material capable of spectroscopic detection of, e.g., ionizing radiation (e.g., particles or photons). Through controlled hydrogen-bonding between an organic capping-ligand on the semiconducting nanoparticles and the para-aramid polymer scaffold, the semiconducting nanoparticles self-assemble into an interconnected network capable of (1) effective absorption of high-energy particles or photons, and (2) efficient transport of generated charge carries through the assembled pathways, while relying on the robust mechanical strength and flexibility imparted by the ANF (e.g., Kevlar-derived) fibers.

In some cases, the disclosed devices and methods use cadmium telluride (CdTe) nanoparticles to achieve efficient conversion of high-energy photons into an electric signal. Other semiconductor nanoparticles may be used. The quantum confinement of semiconducting nanoparticles leads to higher rates of multiple exciton generation compared to bulk materials. This effect is useful because, for instance, the energy of x-rays and gamma-rays often greatly exceeds the bandgap of the detector material. The reduced phonon emission leads to high resolution detection spectra. The response of the disclosed devices may thus be limited by device electronics (e.g., a preamplifier) rather than the performance of the detector materials and structure.

As described herein, the nanostructured nature of the disclosed detectors may provide improved performance for detection of high energy photons and particles. The nanoparticles may exhibit a greater capacity for preventing charge carrier escape. The spectra of the disclosed nanostructured detectors exhibit high energy peaks that are not realized with other detector designs. Such detector designs are forced to use increased volume to achieve suitably good efficiency. In contrast, the nanostructured nature of the disclosed detectors allows the disclosed detectors to be thinner while still achieving good efficiency levels.

Although described herein in connection with detectors for ionizing radiation, the disclosed devices and systems are useful in connection with a wide range of photon or particle energy levels. For instance, the synthesis of the nanoparticles and/or other aspects of the fabrication method may be configured to achieve a desired nanoparticle size and, thus, bandgap. The disclosed detectors and systems may thus be directed to detecting photons of other energy levels, such as visible wavelengths, or particles at other energy levels.

Figure 1:
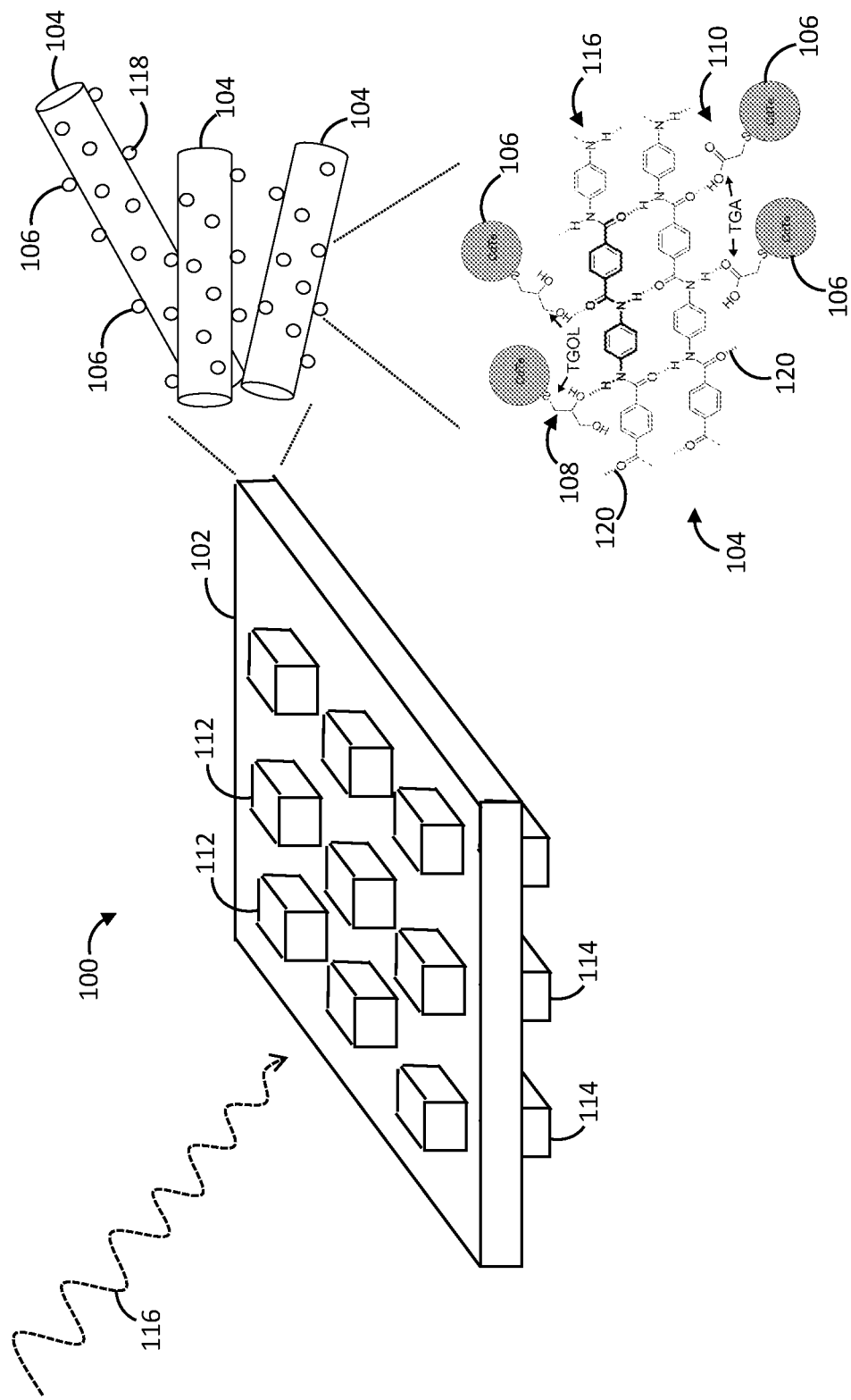
FIG. 1 is a schematic view of a detector having a distribution of nanoparticles across a matrix of aramid nanofibers in accordance with one example.

FIG. 1 schematically depicts a detector 100 having a semiconducting nanocomposite structure in accordance with one example. The detector 100 includes a substrate 102. The substrate 102 may be configured as a film. The substrate 102 includes a matrix of aramid nanofibers (ANF) 104. The substrate 102 may be fabricated and arranged as an ANF hydrogel film.

The nanofibers 104 and the resulting substrate 102 may be grown or formed as described in U.S. Patent Publications Nos. 2013/0288050 ("Synthesis and use of aramid nanofibers") and 2019/0085139 ("Gels and nanocomposites containing ANFs"), the entire disclosures of which are hereby incorporated by reference. Additional or alternative techniques may be used to form the nanofibers 104 and the substrate 102. The dimensions, size, shape, composition, and other characteristics of the nanofibers 104 may also vary. Further details regarding the composition and other characteristics of the nanofibers 104 are set forth below and in the above-referenced publications.

The detector 100 further includes a distribution of nanoparticles 106 across the matrix of aramid nanofibers 104. Each nanoparticle 106 has a semiconductor composition. In some cases, the semiconductor composition is or includes cadmium telluride. For example, the cadmium telluride of the semiconductor composition may provide cadmium and tellurium in a two-to-one ratio, respectively. In other cases, the semiconductor composition is or includes an alternative or additional semiconductor material, such as lead telluride. Further details regarding the nanoparticles 106 are provided below.

The detector 100 further includes a plurality of organic capping ligands 108, 110. Each organic capping ligand 108, 110 bonds a respective nanoparticle 106 of the distribution of nanoparticles to a respective aramid nanofiber 104 of the substrate 102. For instance, the organic capping ligands 108, 110 establish hydrogen bonds with the matrix of aramid nanofibers 204.

In the example of FIG. 1, two different types of organic capping ligands are provided. Some ligands 108 of the organic capping ligands are or include 1-thioglycerol (TGOL). Other ligands 110 of the organic capping ligands are or include thioglycolic acid (TGA). The respective proportions of the organic capping ligands 108, 110 may vary from the example shown. Moreover, fewer, additional, or alternative organic capping ligands may be provided. For instance, the detector 100 may include only TGOL ligands, or only TGA ligands, in some cases.

The detector 100 further includes contacts or other electrodes 112, 114 disposed along opposite sides of the substrate 102. The electrodes 112, 114 are configured to capture charges generated by particles or photons (i.e., radiation) 116 incident upon the detector 100. In some cases, each electrode 112 includes an indium electron transport layer, while each electrode 114 includes a gold hole transport layer. Additional or alternative materials may be used for the electrodes 112, 114. For instance, one or both of the electrodes 112, 114 may include one or more metal or conductive organic oxide layers directed to adhesion or transition.

The substrate 102 and the electrodes 112, 114 may be disposed in respective layers of a planar structure, as shown in FIG. 1. In some cases, the planar structure has a thickness falling in a range from about 10 micrometers to about 3 millimeters, but other thicknesses may be used.

In some cases, the detector 100 includes one or more components in addition to the above-described elements. For example, the detector 100 may further include metal nanoparticles 118 distributed across the matrix of aramid nanofibers 104. In some cases, each metal nanoparticle 118 includes silver. Alternative or additional metals may be used, including, for instance, gold.

Each aramid nanofiber 104 may include a fiber backbone. The nanoparticles 106, 118 may then be aligned along the backbones, as described further hereinbelow.

The nanoparticles 106, 118 may be sized in a manner to facilitate the detection of the photons, particles or other radiation 116. For instance, each nanoparticle 106, 118 may be sized to establish a bandgap for detection of the radiation 116. In some cases, at least some nanoparticles of the distribution of nanoparticles have a diameter of less than about 10 nanometers, but a wide range of other diameters may be used. In some cases, each nanoparticle 106, 118 has a size at least half as large as the hydrogen bonding site spacing of each nanofiber 104. For example, the size of each nanoparticle 106, 118 may fall in a range from about 2 nanometers (nm) to about 20 nm, while the hydrogen bonding sites along each nanofiber may be less than 2 nm, although other sizes and dimensions may be used. For instance, the nanoparticles may be sized relative to pore size of the composite structure, in the sense that the nanoparticles may be less than half of the pore size to avoid clogging the pores. Alternatively or additionally, the nanoparticles may be sized relative to the bond spacing along the nanofiber 104, in the sense that the nanoparticles may be sufficiently large so as to establish point-to-point contact between adjacent nanoparticles.

The arrangement of the nanofibers 104 may vary. In some cases, the arrangement of the nanofibers 104 is irregular as shown. In other cases, the nanofibers 104 are arranged in a regular or semi-regular pattern via, e.g., electrophoresis or other techniques to line up or otherwise arrange the nanofibers 104.

The distribution of the nanoparticles 106, 118 may be uniform or non-uniform. The nanoparticles 106, 118 may thus be distributed randomly across each nanofiber 104. The schematic arrangement shown in FIG. 1 is shown for ease in illustration.

The nanofibers 104 and the nanoparticles 106, 118 are not shown to scale in the schematic depiction of FIG. 1. The shapes of the nanofiber 104 and the nanoparticles 106, 118 may also vary from the example shown. In the chemical depiction of FIG. 1, dotted lines 120 indicate possible hydrogen bonding sites or opportunities. Further details regarding the semiconducting and metal nanoparticles 106, 118 and the nanofibers 104 are provided below.

The incorporation of the nanoparticles 106, 118 into the ANF substrate 102 leads to high conductivity and flexibility due to the controlled assembly of conductive pathways along the fiber backbones. Infiltration of ANF hydrogel films with the CdTe nanoparticles 106 forms a flexible composite material capable of spectroscopically detecting the radiation 116, such as ionizing particles or photons. Through controlled hydrogen-bonding between the organic capping ligands 108, 110 on CdTe and the scaffolding provided by the para-aramid polymer of the substrate 102, the semiconducting nanoparticles 106 self-assemble into an interconnected network capable of effectively absorbing high-energy particles or photons and efficiently transporting the generated charge carries through the assembled pathways, while relying on the robust mechanical strength and flexibility imparted by the Kevlar-derived fibers 104.

The aramid nanofiber matrix is used to not only confer strength and flexibility to the composite material, but the amide groups along the polymer of the substrate 102 provide a regularized template upon which the ligands 108, 110 for the nanoparticles 106, 118 may hydrogen bond and thereby facilitate close-packed self-assembly. If the nanoparticle-to-ANF bonding is weak or the nanoparticle size is not compatible with the bond spacing, then either poor or disordered nanoparticle loading may result.

Further details regarding the alternative materials for use in the semiconducting nanoparticles 106 and the capping ligands 108, 110 are now provided.

Thioglycolic acid (TGA) may be used as a capping ligand for the synthesis of CdTe nanoparticles due to the short length of the ligands. The short length may be useful to attain good nanoparticle-to-nanoparticle coupling and therefore efficient charge transport throughout the composite structure. For instance, initial CdTe/ANF composite structures were black and exhibited a poor response for detecting ionizing particles, which was attributed to inadequate nanoparticle-to-nanoparticle connectivity. This condition may arise from the action of insulating organic components to prevent the efficient charge transport along potential percolation paths within the matrix, a condition that can be exacerbated by the inadequate binding of TGA to the ANF. One method to overcome poor nanoparticle-to-nanoparticle coupling along the nanofibers is to utilize a conductive nanoparticle that not only encrusts the nanofibers and connects discontinuities in the percolation pathways that remained following the CdTe infiltration, but also provides a medium through which charge carriers can be conducted as the carriers are drifted toward the contacts.

Gold (Au) nanoparticles coordinated with citrate, and silver (Ag) nanoparticles coordinated with PVP ligands, are capable of self-assembly along the nanofibers 104 such that a flexible conductive solid may be realized. In order to facilitate the conversion of the incident energy into charge carriers, the semiconducting (e.g., CdTe) nanoparticles 106 may be incorporated together (e.g., simultaneously) with the metal (e.g., Ag) nanoparticles 118. An alternative approach eschews the metal nanoparticles 118, and configures the semiconducting nanoparticles 106 and ligand chemistry such that percolation paths are created with the semiconducting nanoparticles 1-6 alone. To achieve this, a more suitable ligand is used so that percolation pathways form as were demonstrated with metallic nanoparticles in the ANF film.

To functionalize the aramid nanofiber hydrogel with active nanoparticles, the ligand may exhibit strong bonding affinity with the ANF. The ligand may also be a short-chained coordinating ligand to accomplish nanoparticle-to-nanoparticle electrical coupling without chemical ligand removal and exchange and recipes. The ligand may also exhibit colloidal stability so that the nanoparticles in the solution can be bonded before flocculation or aggregation occurs during incorporation. This trade-off is visualized in the schematic depiction of FIG. 1, in which CdTe nanoparticles are coordinated with TGA or 1-thioglycerol (TGOL). TGOL was selected as an alternative ligand because TGOL binds to poly(N-isopropylacrylamide) microspheres through hydrogen bonding better than TGA binds to the polymer spheres. TGOL, however, occupies a larger space than TGA, and the hydrothermal synthesis involves a longer reflux time to reach an adequate nanoparticle size.

Figure 2:
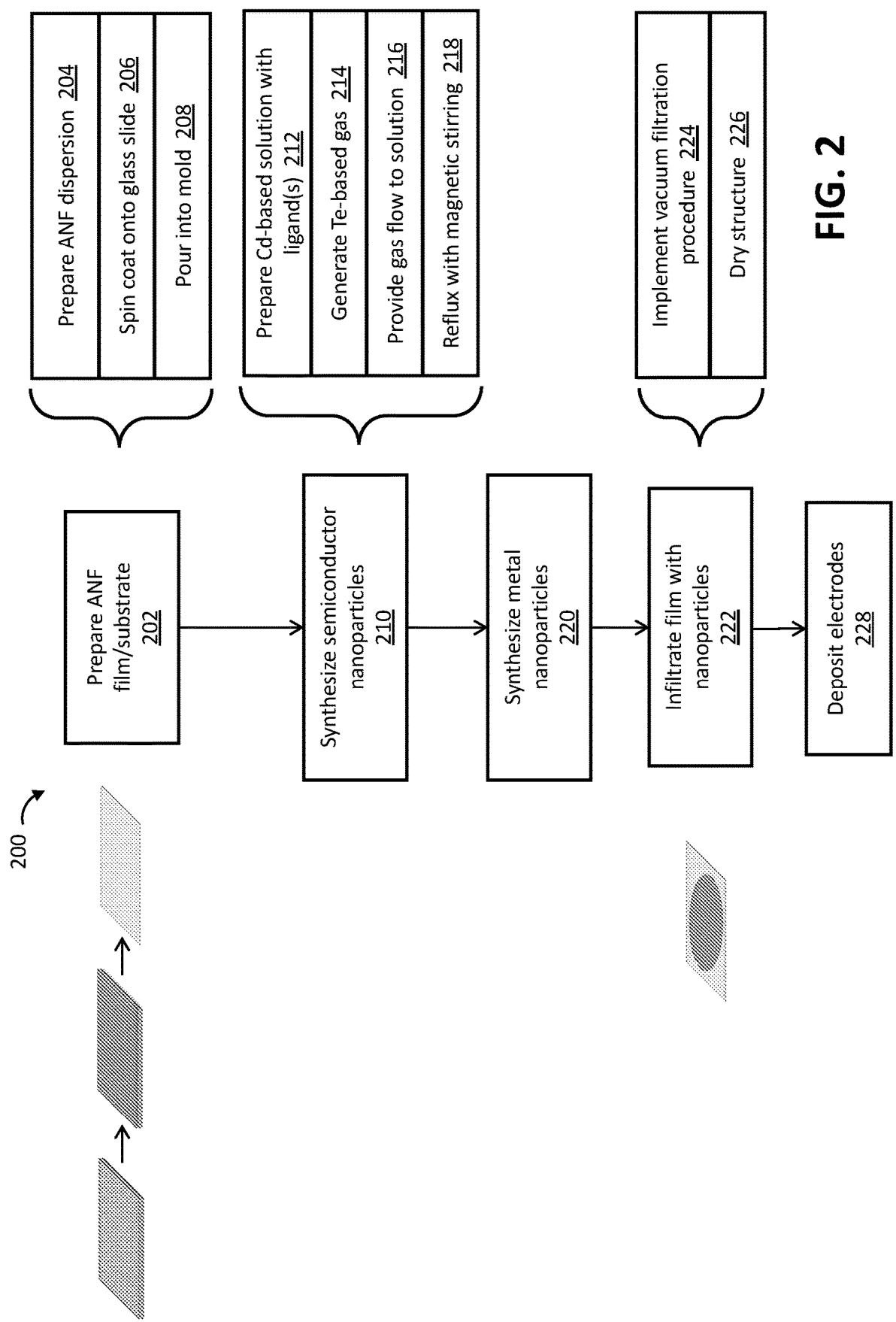
FIG. 2 is a flow diagram of a method of fabricating a detector in which an ANF film is infiltrated with a plurality of semiconductor nanoparticles in accordance with one example.

FIG. 2 depicts a method 200 of fabricating a detector in accordance with one example. The method 200 may be used to manufacture one of the detectors described herein or another detector. The method 200 may include additional, fewer, or alternative acts. For instance, the method 200 may or may not include one or more acts directed to synthesizing metal nanoparticles (act 220).

The method 200 may begin with an act 202 directed to preparing a film or other substrate including a matrix of aramid nanofibers. The act 202 may include one or more procedures described in the above-referenced publications. In the example of FIG. 2, the act 202 may include preparing an ANF dispersion (act 204). The dispersion may then be spin-coated onto a glass slide (act 206), or poured into a mold (act 208). The act 202 may then include immersing the resulting ANF film in water to peel off, or otherwise remove, the film from the slide or mold.

In one example, the ANF film was prepared as follows. 8.0 g of Kevlar thread and 8.0 g of KOH were added to 400 mL of dimethyl sulfoxide (DMSO). The mixture was magnetically stirred at room temperature for over a week until the Kevlar was completely dissolved, forming a dark red viscous solution. This 2 w/v % ANF dispersion was shaped into films either by spin coating onto a glass slide, or by pouring into a custom 3D-printed mold. The thickness of the film was determined by the spin speed. The films were immediately immersed in deionized (DI) water until all of the DMSO was removed, resulting in a yellowish-colored ANF hydrogel film.

The method 200 includes an act 210 in which a plurality of nanoparticles are synthesized in a solution. Each nanoparticle is synthesized such that an organic capping ligand is attached to the nanoparticle. Each nanoparticle has a semiconductor composition, as described herein. In the CdTe-based example of FIG. 2, the act 210 may include preparing a CD-based solution with one or more ligands (act 212), generating a Te-based gas (act 214), providing a flow of the gas to the solution (act 216), and refluxing with magnetic stirring (act 218). For instance, TGOL may be added to the solution to provide the organic capping ligand for each semiconducting nanoparticle. The acts may involve additional or alternative materials and gases in cases involving semiconductors other than CdTe. Further details regarding these and other acts are provided hereinbelow.

In one example of the nanoparticle synthesis of the act 210, 1.4775 g of $Cd(ClO_4)_2 \cdot 6H_2O$ was added to 187.5 mL of DI water in a three-neck round bottom flask. 0.58 mL of TGA or 0.75 mL of TGOL was added slowly (depending on the ligand) to the same flask under continuous magnetic stirring. The pH was then adjusted by dropwise addition of 1 M NaOH to a pH of 11.2. The three-neck flask was attached to a reflux condenser, and $N_2$ was bubbled through for 1 hour. 0.3 g of $Al_2Te_3$ was measured out carefully from the glovebox and transferred into a separate three-neck flask. The $Al_2Te_3$ was allowed 15 minutes of degassing under $N_2$ flow before slowly injecting 37.5 mL of 0.5M sulfuric acid. The generated $H_2Te$ gas was passed along with the $N_2$ gas flow into the other three-neck flask, where nuclei began to form, appearing as a red-orange color. After 30 minutes, the nanoparticle flask was immersed in the 100° C. silicone oil bath, and refluxed under magnetic stirring. The particle size was determined by the reflux time. The CdTe nanoparticles were purified via dialysis (2 kDa cutoff) in ePure water for 24 hours.

The method 200 may include an act 220 in which a plurality of metal nanoparticles are synthesized in a further solution. For instance, silver nanoparticles may be synthesized as described herein.

In one example of the act 220, 200 ml of ePure water was added to a 250 mL three-neck flask. 0.294 g of trisodium citrate dihydrate and 0.034 g of tannic acid were added to the flask. The flask was brought to boiling by heating in a silicone oil bath, and refluxed under magnetic stirring. After the solution had reached 100° C. for 15 minutes, 8 mL of a 25 mM solution of silver nitrate was injected into the flask. The flask continued reflux under stirring for another 15 minutes, until the solution turned a yellow-brown color. The solution was allowed to cool, and the nanoparticles were purified by centrifugation at 15 k×g for 30 minutes, to separate excess tannic acid. The collected Ag nanoparticles were re-dispersed in ePure water.

In an act 222, the film is infiltrated with the plurality of nanoparticles. In the example of FIG. 2, the act 222 includes implementing a vacuum filtration procedure (act 224) in which the film is disposed as a filtration membrane. The resulting composite structure may then be dried in an act 226. The act 222 may be configured such that the film is infiltrated with the nanoparticles such that each nanoparticle is bonded to a respective aramid nanofiber of the matrix of aramid nanofibers via an organic capping ligand.

In one example, the vacuum filtration procedure proceeded as follows. The CdTe nanoparticles were adjusted to pH 9.0 for TGA and pH 7.0 for TGOL by dropwise addition of dilute HCl. The CdTe nanoparticles were forced to infiltrate the ANF film using a vacuum filtration setup, where the ANF film takes the place of the filtration membrane. The CdTe/ANF films may be sandwiched between two sheets of porous cellophane, and clamped into a gel drying frame, where the film then air-dried at room temperature overnight.

The nanoparticles may be sequentially incorporated. For instance, the film may be first infiltrated with the nanoparticles having the semiconductor composition. The film may then be infiltrated with the metal nanoparticles after the incorporation of the semiconducting nanoparticles. For one example involving hybrid CdTe—Ag/ANF, CdTe nanoparticles were flowed through the film first, followed by the Ag nanoparticles.

Contacts or other electrodes may be deposited in an act 228. The electrodes may be selectively deposited using photolithography. Arrays of first and second electrodes may thus be deposited along opposite sides of the film.

The acts of the method 200 may be implemented in an order other than as shown in FIG. 2. For instance, the nanoparticles may be incorporated into the ANF hydrogel in a different order.

Figure 3:
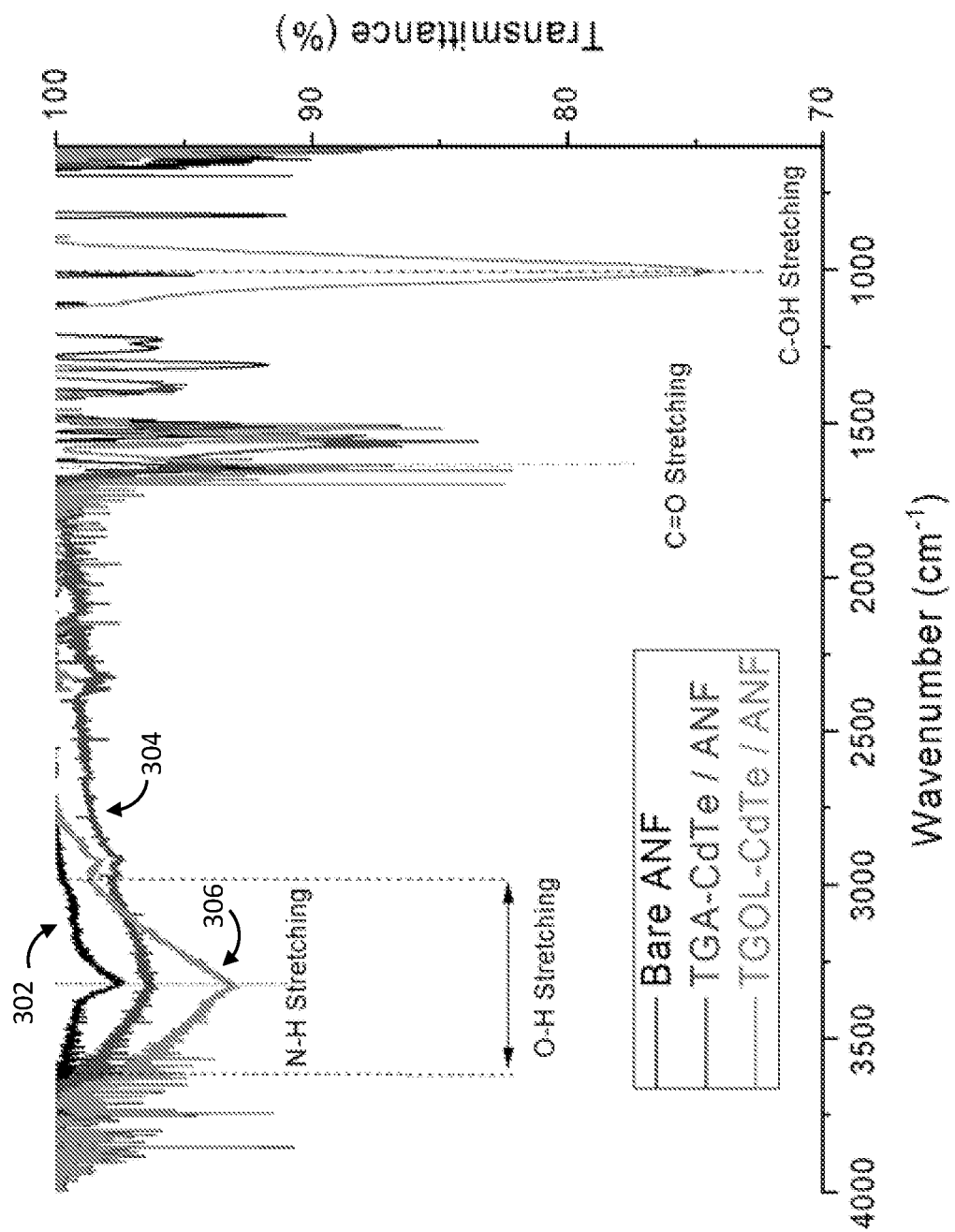
FIG. 3 is a graphical plot of transmittance as a function of wavenumber for several detectors, including detectors having a distribution of semiconductor nanoparticles across a matrix of aramid nanofibers (ANF) in accordance with two examples.

FIG. 3 depicts the results of incorporating TGA-stabilized CdTe and TGOL-stabilized CdTe nanoparticles into separate ANF films using the method 200 depicted in FIG. 2. Fourier-transform infrared spectroscopy (FT-IR) was used to determine which ligand exhibited stronger hydrogen bonding with the ANF. FIG. 3 depicts transmission-mode FTIR measurements of bare ANF (referenced at 302) and ANF loaded with CdTe coordinated with either TGA (referenced at 304) or TGOL (referenced at 306) ligands. Specifically, compared with the spectrum derived from the bare ANF solid, the solid that includes TGA-CdTe nanoparticles (304) has weak enhancement of the secondary amine N—H stretching peak (compared to what exists in bare ANF) at 3320 $cm^{-1}$, indicating low hydrogen bonding between TGA and the N—H group on the amides of the Kevlar fibers. The broad peak in the range of 3200-3550 $cm^{-1}$ corresponds to intermolecular bonded O—H stretching. For TGA, this broad peak overpowers the N—H peak that it overlaps, indicating that the intermolecular bonding with TGA occurs primarily at the amide C=O peak around 1680 $cm^{-1}$, which shows enhancement compared to the bare ANF spectrum. Comparatively, the TGOL-coordinated nanoparticles (306) results in enhanced absorption at the secondary amine N—H stretching and intermolecular O—H stretching compared to the TGA-CdTe case. The amide C=O stretching for TGOL-CdTe is comparable to TGA, but furthermore gives rise to a large peak centered at 1015 $cm^{-1}$ which corresponds to C—OH stretching from primary alcohols, with the superposition of a smaller secondary alcohol C—OH stretching peak around 1100 $cm^{-1}$. This indicates more extensive bonding along the ANF backbone for TGOL-stabilized CdTe nanoparticles compared to TGA-stabilized CdTe, and exists predominately with the primary (terminal) alcohol on TGOL binding with both the N—H and C=O locations in the ANF amide functional groups. A leading explanation for the improved hydrogen-bonding of TGOL compared to TGA is that TGOL-CdTe has colloidal stability at pH values lower than its $pK_a$ of 9.43, whereas the TGA-CdTe has a much lower $pK_a$ value of 3.6, which is not colloidally stable at pH values lower than that $pK_a$. A significantly higher fraction of TGOL ligands may thus be protonated at relevant pH values compared to TGA, leading to TGOL experiencing stronger hydrogen-bonding interactions with the ANF.

The larger molecular structure of TGOL may impact the nanoparticle-to-nanoparticle coupling during charge transport. TGA-CdTe nanoparticles may be electrically incorporated well within the composite structure when coupled with metal nanoparticles that grafted upon the ANF. However, for those CdTe-ANF solids that lacked such metallic linkers, excellent spectroscopic performance was realized with TGOL-coordinated CdTe nanoparticles. This result reflects the utility of using the polymer backbone to encourage the self-assembly of the nanoparticles in or along suitable charge-transport percolation paths.

Figure 4:
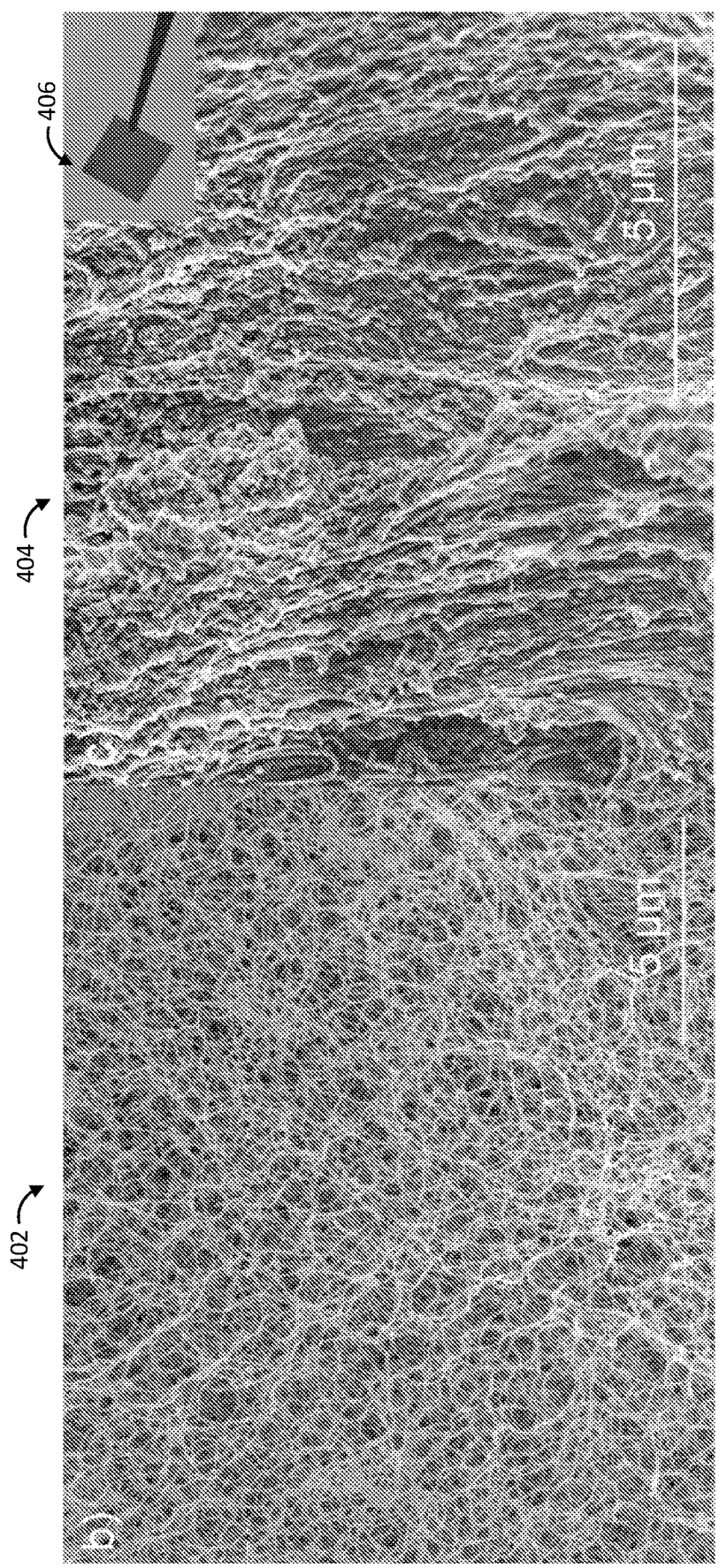
FIG. 4 depicts plan, scanning electron micrograph (SEM) views of an ANF film before and after incorporation of the semiconductor nanoparticles.

FIG. 4 depicts a scanning electron micrograph (SEM) image 402 of a bare ANF solid 402, and an SEM image 404 of a CdTe-ANF solid. In this case, the SEM images 402, 404 depict the ANF solid before and after infiltration of TGOL-CdTe nanoparticles. An inset shows an image 406 of a free-standing film after TGOL-CdTe incorporation.

In the example of FIG. 4, the TGOL-CdTe nanoparticles are synthesized as 3 nm nanoparticles. The SEM image 404 shows that the nanoparticles self-assemble into monodisperse supraparticles with a diameter of about 100 nm. The inset displays a cut-out section of the resulting free-standing TGOL-CdTe/ANF film, which retains a red color, derived from the red-orange color of the original nanoparticle colloid. This is in stark contrast to TGA-CdTe/ANF films, in which the freestanding film turned a black color and individual CdTe nanoparticles could not be visually identified under SEM. The SEM image 404 clearly shows that there are percolation pathways formed by the TGOL-CdTe nanoparticles throughout the solid. Thermogravimetric analysis was utilized to determine the fraction of CdTe within the fabricated ANF composite structure.

The disclosed detectors are robust against repeated bending. The composite structures may be repeatedly bent with no degradation in mechanical or electrical properties. For instance, the repeated bending of the composite structure does not adversely impact the electrical transport characteristic. The IV-characteristic of the composite structures may thus remain unchanged. The ultimate strength is not adversely impacted even if the solid is significantly loaded (e.g., to 40% by weight), at which percolation paths can be formed throughout the material. However, the ultimate strain is diminished as the particles are loaded to higher volume percentages. The physical mechanism that results in the reduction in the degree to which one can stretch the material before breaking is that the nanoparticles prevent the polymeric tangles in the ANF from unfolding during stretching, a process that can allow one to stretch the bare ANF by up to 50%. The ANF still governs the failure of the solid, as revealed through an equivalent ultimate strength and the equivalent Young's modulus, but it cannot be stretched to the same degree. The composite structures of the disclosed detectors may nonetheless be deployed as a flexible, wearable solid.

Figure 5:
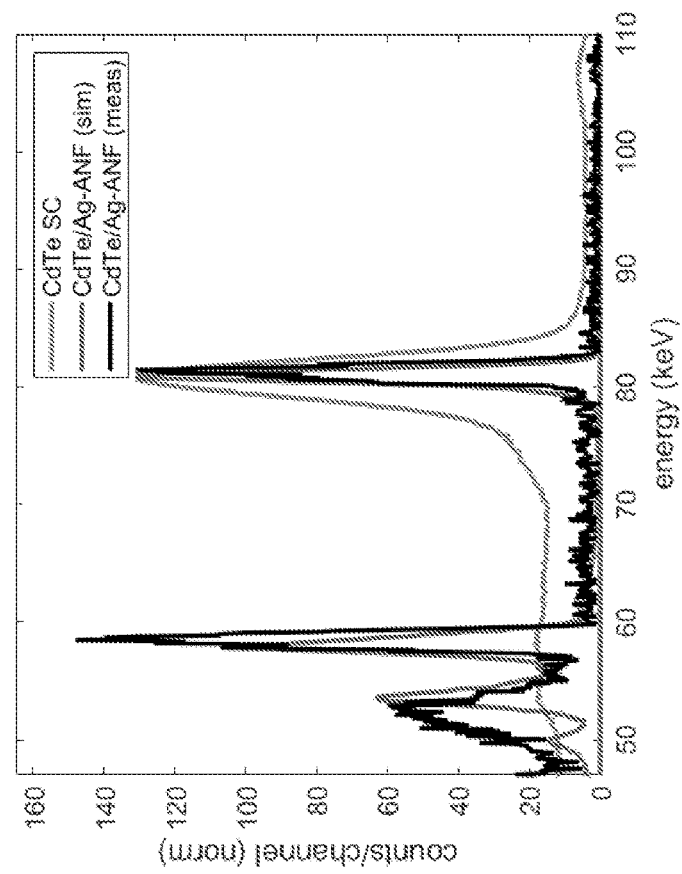
FIG. 5 depicts graphical plots of spectral outputs of a CdTe single-crystalline (SC) detector (red) and nanostructured CdTe/Ag-ANF composite detectors (shown in inset), when exposed to x-rays and gamma-rays emitted from Ba-133.
Figure 5:
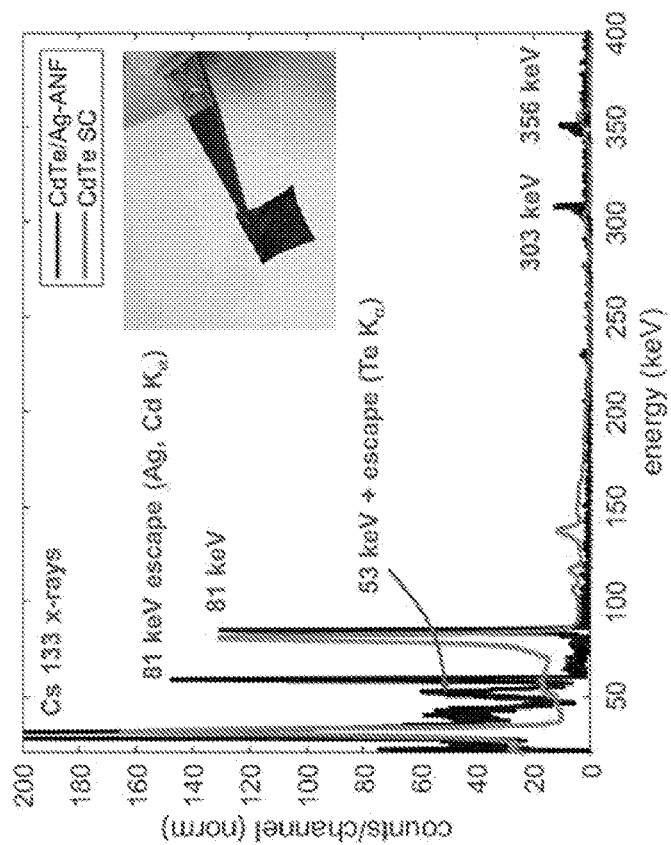
Figure 6:
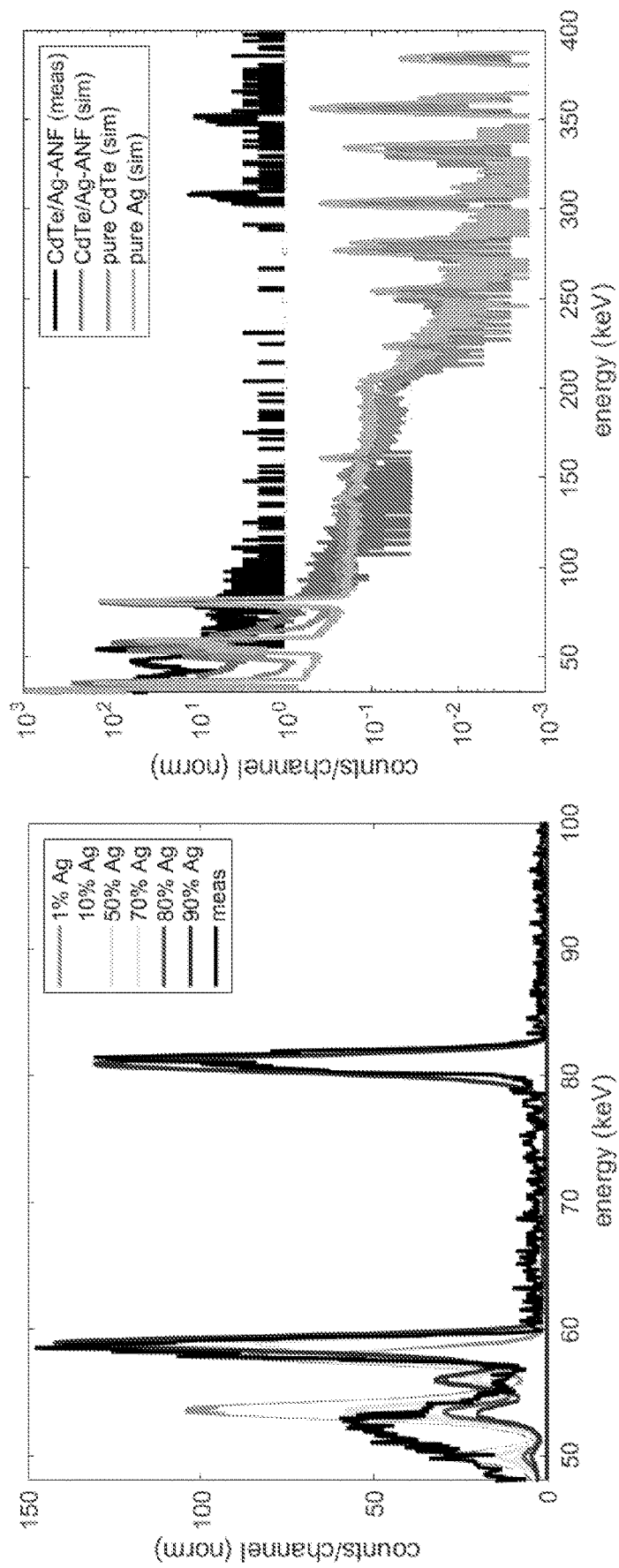
FIG. 6 depicts graphical plots of spectral outputs of various structures, including composite structures of varying Ag content, in accordance with several examples.

FIGS. 5 and 6 depict the spectroscopic properties of examples of the composite structures of the disclosed detectors. The high-energy photon response of the composite structures was evaluated by impinging both x-rays and gamma-rays upon the solid from a barium-133 (133Ba) isotopic radioactive source. FIG. 5 shows that the energy resolution of a free-standing flexible nanostructured CdTe/Ag-ANF composite structure, shown in the inset image, is superior to that of a commercial single-crystalline CdTe detector, despite the fact that the size-dependent band-gap, at 2.1 eV, is larger than that in the bulk CdTe device (1.474 eV). In fact, the 1.66 keV measured resolution at 81 keV is dominated by the electronic noise of the first-stage amplifier, as shown by a pulser-derived peak.

FIG. 6 shows that the presence of the organic matrix and Ag nanoparticles does not adversely affect performance. One might reasonably expect that poor spectroscopic performance would be delivered by a composite structure composed of sizable contributions of constituents—the organic matrix and metal NPs—that do not participate in the direct conversion of energy into information carriers. In fact, the spectral comparisons shown in FIG. 6 indicate that Ag does participate heavily in capturing the energy information from the photon. Specifically, the 81 keV x-ray escape peak at 58 keV includes components from both Cd (57.82 keV) and Ag (58.84 keV).

FIG. 6 also depicts the spectral outputs relative to simulation data for the composite structure. In order to match the prominence of the peak measured from the detector, relative to that of the 81 keV peak, Monte Carlo N-Particle Code (MCNP) simulations indicate that at least 50% of the solid is to be composed of Ag relative to the CdTe composition, and that the peak heights match only when substantial energy loss in the Ag is present. Because the 81 keV electron ranges in Ag over a path length of about 10 micrometers, the secondary electron is capable of exiting the nanoparticle with minimal energy loss and in fact range over about 500 nanoparticles before losing all of its energy. Nevertheless, any spectral degradation due to the thermal losses in the metallic constituents are not observable in the measured spectrum because the noise floor of the front-end preamplifier governs the noise floor.

In attempting to match the MCNP simulation data with the measured results, an unexpected outcome was observed. Specifically, the higher energy peaks shown in FIG. 5 were unusually prominent, particularly given the fact that electron-transport simulations indicated that since the detector thickness was only about 30 to about 50 micrometers, the secondary electrons from the 356 keV gamma-ray should not stop in the detector thickness and therefore contribute their full energy. FIG. 5 shows that if one injects a 81 keV (top) or 356 keV (bottom) electron into solid CdTe with density 5.85 g/cm$^3$ then the 81 keV electron can stop within a longitudinal range of about 10 microns. However, 95% of the 356 keV electrons transit through the 50 micron solid without depositing all of their energy. Furthermore, note that this is the best-case scenario because the measured density of the nanostructured solid is almost three times lower (2.17 g/cm$^3$) and the secondary electrons are injected throughout the thickness because they are deposited by the corresponding gamma-rays.

The MCNP simulation results of FIG. 6 capture the combined effects of photoelectric capture and secondary electron escape in: (1) a realistic simulation of the CdTe/Ag-ANF composite (600), (2) a 5.85 g/cm$^3$ dense CdTe solid of 50 micron thickness (602) and (3) a 10.49 g/cm$^3$ Ag solid of 50 micron thickness (604). Even if a high-density, solid Ag solid is simulated, the 302 keV and 356 keV peaks are an order of magnitude higher. The simulated results for the actual solid is about three orders of magnitude smaller than the measured results.

FIG. 7 depicts an example of a detector with a TGOL-CdTe composite structure and a point contact. The TGOL-CdTe composite structure does not include metal nanoparticles. As shown in FIG. 7, the TGOL-CdTe nanoparticles infiltrate effectively through the ANF (with a 31 wt % loading). The fact that the film assumes the same color (red) as the colloidal solution reflects the fact that the particle aggregation is minimized, and generally establishes that the films are capable of working well. Even the samples that included the metal nanoparticles reflected the nanoparticle color. The CdTe nanoparticles are too small to image with SEM, but SEM micrographs show uniform clustering throughout the composite structure.

FIG. 8 depicts the spectroscopic output of the detector of FIG. 7 for a Ba-133 gamma ray source. When contacted with a point contact as shown in FIG. 7, the detector is spectroscopic and exhibits good resolution (e.g., 1.1% at 662 keV). The detection volume may be increased by evaporating contacts upon the sensor surface.

FIG. 9 depicts an example of a detector with evaporated contacts. The detector has high work-function gold evaporated on one side of the device and low work-function indium evaporated on the opposite face.

FIG. 9 also shows the leakage current for different contact areas. The higher leakage current that accompanies larger area can be diminished through surface treatments and guard rings. The detector may be operated at a lower voltage to avoid the leakage current degradation.

As shown in FIG. 10, the detector of FIG. 9 exhibited a good alpha peak, showing the uniform collection of charge across the volume. The charge was collected for only 300 seconds.

FIG. 11 depicts measured and simulated gamma-ray spectra from $^{133}$Ba from a CdTe:ANF detector in accordance with one example. In this case, the composite structure of the detector has a size of approximately 1×1 cm² and a thickness of about 36 microns. The measured data is depicted in the left two plots. The simulated data is depicted in the right two plots.

When a strong 1 mCi $^{133}$Ba source is impinged upon the solid, the detector is capable of spectroscopically counting the gamma rays with high enough efficiency that short runs (e.g., 5 minutes) are capable of measuring the spectroscopic nature of the source. As shown in the lower-left measured spectrum, the measured energy resolution is very good, i.e., 3.1% (5.8 keV) at 81 keV, which translates into sub-1% resolution at 662 keV. The energy resolution may be affected by additional noise arising from the leakage current of the device. Nevertheless, the CdTe-ANF device has an energy resolution that matches that of a commercial CdTe solid.

The thickness of the composite structure may vary from the examples described herein. For instance, the composite structures may have thicknesses having a higher order of magnitude than 10 microns.

FIG. 12 depicts a technique for making thicker composite structures in accordance with one example. In this case, the technique relies upon three-dimensional, printed molds into which the ANF solution is poured. The ANF solution is then hydrolyzed through water infiltration through the access holes on the side of the mold, which is useful to prevent pore-size collapse on the broad surfaces. For instance, a 1 cm thick ANF structure reduces in thickness to 6 mm during freeze drying, an acceptable degree of shrinkage because the pores are still maintained in the solid, as shown in the SEM images of FIG. 12. A thick chunk of ANF may thus be made, while also establishing that the composite structures involve nanoparticles encrusted along the nanofibers throughout the solid.

FIG. 13 demonstrates an example of the realization of such thick structures with the 1.5 mm thick molds shown therein. The mold-based technique may be applied to achieve still thicker structures.

FIG. 14 depicts the spectroscopic performance of the composite structure of FIG. 13. The CdTe-ANF composite structure exhibits enhanced efficiency to high energy gamma-rays. As shown in FIG. 14, a greater prominence of higher energy features is realized than would be expected. Specifically, the MCNP-simulated line (1400) in FIG. 14 drops to unobservable values after the 81 keV peak, while the thicker single-crystalline CdTe (1402) and the nanostructured CdTe-ANF device (1404) both show the higher energy features. Specifically, the gamma-ray emission at 160 keV is evident in the CdTe-ANF response. This same peak is evident in the MCNP-simulated response, as shown in the logarithmic plot of FIG. 14, but it is three orders of magnitude smaller than the 81 keV, rather than one order of magnitude smaller, as expected. Higher intrinsic efficiency to higher energy gamma-rays in nanostructure materials is thus indicated on a relative basis.

FIG. 15 shows a comparison of examples of the CdTe-ANF detector (1500) and the CdTe/Ag-ANF detector (1502). Both have comparable responses if it is taken into account the fact that that the Ag-induced x-ray escape peaks are prominent in the CdTe/Ag-ANF composite, and the higher leakage current of the CdTe-ANF device (with larger area) results in some blending of the lower features.

The above-described results show the disclosed methods and devices are capable of realizing wearable detectors with resolutions comparable to single-crystalline semiconductors (CZT, Si). Notwithstanding those results, semiconducting materials other than CdTe may be used in other examples. For instance, PbTe may be used rather than CdTe because of, for instance: (1) its greater stopping power (due to higher Z and density), and (2) high Bohr radius (152 nm) that results in very strong confinement in large nanoparticles. Note that although PbTe has a bulk band-gap of 0.3 eV, 20 nm nanoparticles have a band-gap of over 3 eV, showing that PbTe may be used to provide a very wide band-gap semiconductor. Still other materials for use in the semiconducting nanoparticles include PbSe.

The present disclosure has been described with reference to specific examples that are intended to be illustrative only and not to be limiting of the disclosure. Changes, additions and/or deletions may be made to the examples without departing from the spirit and scope of the disclosure.

The foregoing description is given for clearness of understanding only, and no unnecessary limitations should be understood therefrom.

What is claimed is:

1. A detector comprising:
a substrate comprising a matrix of aramid nanofibers;
a distribution of nanoparticles across the matrix of aramid nanofibers;
a plurality of organic capping ligands, each organic capping ligand of the plurality of organic capping ligands bonding a respective nanoparticle of the distribution of nanoparticles to a respective aramid nanofiber of the matrix of aramid nanofibers; and
first and second electrodes disposed along opposite sides of the substrate to capture charges generated by photons or particles incident upon the detector;
wherein each nanoparticle of the distribution of nanoparticles has a semiconductor composition.

2. The detector of claim 1, wherein:
each aramid nanofiber of the matrix of aramid nanofibers comprises a fiber backbone; and
the nanoparticles of the distribution of nanoparticles are aligned along the backbones of the matrix of aramid nanofibers.

3. The detector of claim 1, wherein the plurality of organic capping ligands establish hydrogen bonds with the matrix of aramid nanofibers.

4. The detector of claim 1, wherein each organic capping ligand of the plurality of organic capping ligands comprises 1-thioglycerol (TGOL).

5. The detector of claim 1, wherein each organic capping ligand of the plurality of organic capping ligands comprises Thioglycolic acid (TGA).

6. The detector of claim 1, wherein the semiconductor composition comprises cadmium telluride.

7. The detector of claim 6, wherein the cadmium telluride comprises cadmium and tellurium in a two-to-one ratio, respectively.

8. The detector of claim 1, wherein the semiconductor composition comprises lead telluride.

9. A detector comprising:
a substrate comprising a matrix of aramid nanofibers;
a distribution of nanoparticles across the matrix of aramid nanofibers;
a plurality of organic capping ligands, each organic capping ligand of the plurality of organic capping ligands bonding a respective nanoparticle of the distribution of nanoparticles to a respective aramid nanofiber of the matrix of aramid nanofibers;
first and second electrodes disposed along opposite sides of the substrate to capture charges generated by photons or particles incident upon the detector; and
a plurality of metal nanoparticles distributed across the matrix of aramid nanofibers;

wherein each nanoparticle of the distribution of nanoparticles has a semiconductor composition.

10. The detector of claim 9, wherein each metal nanoparticle of the plurality of metal nanoparticles comprises silver.

11. The detector of claim 1, wherein:
the first electrode comprises a gold hole transport layer; and
the second electrode comprises an indium electron transport layer.

12. The detector of claim 1, wherein each nanoparticle of the distribution of nanoparticles is sized to establish a bandgap for detection of ionizing radiation.

13. The detector of claim 1, wherein at least some nanoparticles of the distribution of nanoparticles have a diameter less than about 10 nanometers.

14. The detector of claim 1, wherein the substrate and the first and second electrodes are disposed in respective layers of a planar structure.

15. The detector of claim 14, wherein the planar structure has a thickness falling in a range from about 30 micrometers to about 50 micrometers.

16. A method of fabricating a detector, the method comprising:
preparing a film comprising a matrix of aramid nanofibers;
synthesizing, in a solution, a plurality of nanoparticles, each nanoparticle of the plurality of nanoparticles being synthesized such that an organic capping ligand is attached to the nanoparticle; and
infiltrating the film with the plurality of nanoparticles such that each nanoparticle of the plurality of nanoparticles is bonded to a respective aramid nanofiber of the matrix of aramid nanofibers via the organic capping ligand;
wherein each nanoparticle of the plurality of nanoparticles has a semiconductor composition.

17. The method of claim 16, wherein synthesizing the plurality of nanoparticles comprises implementing a vacuum filtration procedure in which the film is disposed as a filtration membrane.

18. The method of claim 16, further comprising:
synthesizing, in a further solution, a plurality of metal nanoparticles; and
infiltrating the film with the plurality of metal nanoparticles after infiltrating the film with the plurality of nanoparticles having the semiconductor composition.

19. The method of claim 16, further comprising depositing first and second electrodes along opposite sides of the film.

20. The method of claim 16, wherein synthesizing the plurality of nanoparticles comprises adding 1-thioglycerol (TGOL) to the solution to provide the organic capping ligand for each nanoparticle of the plurality of nanoparticles.

* * * * *